United States Patent
Noda et al.

(10) Patent No.: US 11,377,522 B2
(45) Date of Patent: Jul. 5, 2022

(54) SILICON-CONTAINING POLYMER, FILM-FORMING COMPOSITION, METHOD FOR FORMING SILICON-CONTAINING POLYMER COATING, METHOD FOR FORMING SILICA-BASED COATING, AND PRODUCTION METHOD FOR SILICON-CONTAINING POLYMER

(71) Applicant: TOKYO OHKA KOGYO CO., LTD., Kawasaki (JP)

(72) Inventors: Kunihiro Noda, Kawasaki (JP); Takehiro Seshimo, Kawasaki (JP); Keisuke Kubo, Kawasaki (JP); Yohei Kinoshita, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 162 days.

(21) Appl. No.: 16/871,962

(22) Filed: May 11, 2020

(65) Prior Publication Data
US 2020/0362115 A1 Nov. 19, 2020

(30) Foreign Application Priority Data
May 14, 2019 (JP) .............................. JP2019-091495

(51) Int. Cl.
| | |
|---|---|
| *C08G 77/28* | (2006.01) |
| *C08G 77/392* | (2006.01) |
| *C08L 83/08* | (2006.01) |
| *B05D 1/00* | (2006.01) |
| *B05D 3/02* | (2006.01) |
| *C09D 183/08* | (2006.01) |
| *B05D 1/02* | (2006.01) |
| *C08G 77/60* | (2006.01) |
| *B05D 3/00* | (2006.01) |

(52) U.S. Cl.
CPC .............. *C08G 77/28* (2013.01); *B05D 1/005* (2013.01); *B05D 1/02* (2013.01); *B05D 3/02* (2013.01); *C08G 77/392* (2013.01); *C08G 77/60* (2013.01); *C08L 83/08* (2013.01); *C09D 183/08* (2013.01); *B05D 3/007* (2013.01)

(58) Field of Classification Search
CPC ....... C08G 77/28; C08G 77/392; C08G 77/60
See application file for complete search history.

(56) References Cited

U.S. PATENT DOCUMENTS

| | | | |
|---|---|---|---|
| 2009/0287015 A1* | 11/2009 | Biteau ................ | C07F 7/1804 560/147 |
| 2020/0032103 A1* | 1/2020 | Fujiwara .............. | C09D 5/1675 |

FOREIGN PATENT DOCUMENTS

| | | | |
|---|---|---|---|
| JP | 07-291981 A | * | 7/1995 |
| JP | 2003-147208 | * | 5/2003 |
| JP | 2009-185169 | * | 8/2009 |
| JP | 2015-108087 A | | 6/2015 |
| WO | WO 2018/186167 | * | 11/2018 |

OTHER PUBLICATIONS

"A Facile Route to Multifuncitonal Cage Sllsesquioxanes via the Photochemical Thiol-ene Reaction" authored by Xue et al. and published in the Journal of Organometallic Chemistry (2015) 783,49-54.*
"Protective Coatings for AA 2024 based on Cyclotetrasiloxane and Various Alkoxysilanes" authored by Rodosek et al. and published in Corrosion Science (2017) 126, 55-68.*
Abstract for CN 106279694 (Jan. 2017).*
Machine translation of JP 2003-147208 (no date).*
Abstract for CN 106279703 (Jan. 2017).*
Machine translation of CN 106279703 into English (no date).*

* cited by examiner

*Primary Examiner* — Marc S Zimmer
(74) *Attorney, Agent, or Firm* — Knobbe Martens Olson & Bear LLP

(57) ABSTRACT

A silicon-containing polymer which results in a composition that forms a coated film having good adhesive properties to a substrate and does not easily peel off the substrate, a film-forming composition including the polymer, a method for forming a silicon-containing polymer coating using the composition, a method for forming a silica-based coating using the composition, and a production method for the polymer. In a silicon-containing polymer including at least one of poly- or oligo-siloxane chain and poly- or oligo-silane chain in a molecular chain, a group having a silyl group and a sulfide group, which can be subjected to a condensation reaction, is introduced into the molecular chain, for example, by an ene-thiol reaction.

11 Claims, No Drawings

SILICON-CONTAINING POLYMER, FILM-FORMING COMPOSITION, METHOD FOR FORMING SILICON-CONTAINING POLYMER COATING, METHOD FOR FORMING SILICA-BASED COATING, AND PRODUCTION METHOD FOR SILICON-CONTAINING POLYMER

RELATED APPLICATIONS

This application claims priority to Japanese Patent Application No. 2019-091495, filed May 14, 2019, the entire contents of which are incorporated herein by reference.

BACKGROUND OF THE INVENTION

Field of the Invention

The present invention relates to a silicon-containing polymer, a film-forming composition including the silicon-containing polymer, a method for forming a silicon-containing polymer coating using the film-forming composition, a method for forming a silica-based coating using the film-forming composition, and a production method for the above-described silicon-containing polymer.

Related Art

Silica-based coatings are used in various applications, for example, interlayer insulating films in various elements, sealing materials in light-emitting devices such as LED devices and organic EL devices, coated films for diffusing an impurity across semiconductor substrates, and gap-filling material for semiconductor processing. Such silica-based coatings are typically formed by applying a liquid composition containing a silicon-containing resin, such as a siloxane resin, to a substrate to form a coated film and then baking the resulting coated film. As materials for forming coated films used when forming such silica-based coatings, a liquid composition including a siloxane resin with a particular structure, silica, and an organic solvent is known, for example (Patent Document 1).

Patent Document 1: Japanese Unexamined Patent Application, Publication No. 2015-108087

SUMMARY OF THE INVENTION

In cases where a silica-based coating is formed by forming a coated film using a composition as described in Patent Document 1 and baking the formed coated film, for example, the coated film can be peeled off depending on a transferring method when a substrate including the coated film is transferred to e.g., a baking furnace for baking.

From such circumstances, a silicon-containing polymer to give a composition capable of forming a coated film having good adhesive properties to a substrate and being not easily peeled off from the substrate, has been demanded.

The present invention was made in view of the above problem, and an object thereof is to provide a novel silicon-containing polymer to give a composition capable of forming a coated film having good adhesive properties to a substrate and being not easily peeled off from the substrate, a film-forming composition including the silicon-containing polymer, a method for forming a silicon-containing polymer coating using the film-forming composition, a method for forming a silica-based coating using the film-forming composition, and a production method for the above-described silicon-containing polymer.

The present inventors found that the above problem could be solved, in a silicon-containing polymer including at least one of poly- or oligo-siloxane chain and poly- or oligo-silane chain in a molecular chain, by introducing a group having a silyl group and a sulfide group, which can be subjected to a condensation reaction, into the molecular chain, for example, by an ene-thiol reaction, thereby completing the present invention. More particularly, the present invention provides the following.

The first aspect of the present invention is a silicon-containing polymer including at least one of poly- or oligo-siloxane chain and poly- or oligo-silane chain in a molecular chain, wherein one or more groups represented by the following formula (1) are bound onto a silicon atom in the silicon-containing polymer;

$$-R^1-S-R^2-SiR^3_n R^4_{(3-n)} \qquad (1)$$

wherein, in the formula (1), $R^1$ and $R^2$ are each independently a hydrocarbon group having 1 or more and 10 or less carbon atoms, $R^3$ is a hydroxy group or a group to form a silanol group by hydrolysis, $R^4$ is an optionally substituted hydrocarbon group having 1 or more and 10 or less carbon atoms, and n is an integer of 1 or more and 3 or less.

The second aspect of the present invention is a film-forming composition including the silicon-containing polymer (A) according to the first aspect and a solvent (S).

The third aspect of the present invention is
a method for forming a silicon-containing polymer coating, the method including:
a step of forming a coated film by applying the above-described film-forming composition on a substrate, and
a step of drying the coated film.

The fourth aspect of the present invention is
a method for forming a silica-based coating, the method including:
a step of forming a coated film by applying the film-forming composition according to the second aspect on a substrate, and
a step of drying the coated film to form a silicon-containing polymer coating and then baking the silicon-containing polymer coating or baking the coated film.

The fifth aspect of the present invention is a production method for the silicon-containing polymer according to the first aspect, the production method including causing an ene-thiol reaction between a precursor polymer which includes at least one of poly- or oligo-siloxane chain and poly- or oligo-silane chain in a molecular chain and in which an unsaturated hydrocarbon group represented by the following formula (2-I) or a mercapto group-containing group represented by the following formula (2-II) is bound onto a silicon atom, and a carboxylic acid derivative represented by the following formula (1-I), or an unsaturated group-containing compound represented by the following formula (1-II);

$$-R^5-CR^6=CH_2 \qquad (2\text{-}I)$$

wherein, in the formula (2-I), $R^5$ is a single bond or a hydrocarbon group having 1 or more and 8 or less carbon atoms, $R^6$ is a hydrogen atom or a hydrocarbon group having 1 or more and 8 or less carbon atoms, and in cases where both $R^5$ and $R^6$ are hydrocarbon groups, the sum of the number of carbon atoms in the hydrocarbon group as $R^5$ and the number of carbon atoms in the hydrocarbon group as $R^6$ is 2 or more and 8 or less,

$$-R^1-SH \qquad (2\text{-}II)$$

wherein, in the formula (2-II), $R^1$ is the same as the $R^1$ in the formula (1),

$$\text{HS} - R^2 - \text{SiR}^3{}_n R^4{}_{(3-n)} \quad (1\text{-I})$$

wherein, in the formula (1-I), $R^2$, $R^3$, $R^4$, and n are the same as the $R^2$, $R^3$, $R^4$, and n in the formula (1),

$$\text{CH}_2 = \text{CR}^8 - R^7 - \text{SiR}^3{}_n R^4{}_{(3-n)} \quad (1\text{-II})$$

wherein, in the formula (1-II), $R^3$, $R^4$, and n are the same as $R^3$, $R^4$, and n in the formula (1), $R^7$ is a single bond or a hydrocarbon group having 1 or more and 8 or less carbon atoms, $R^8$ is a hydrogen atom or a hydrocarbon group having 1 or more and 8 or less carbon atoms, and in cases where both $R^7$ and $R^8$ are hydrocarbon groups, the sum of the number of carbon atoms in the hydrocarbon group as $R^7$ and the number of carbon atoms in the hydrocarbon group as $R^8$ is 2 or more and 8 or less.

The present invention makes it possible to provide a novel silicon-containing polymer to give a composition capable of forming a coated film having good adhesive properties to a substrate and being not easily peeled off from the substrate, a film-forming composition including the silicon-containing polymer, a method for forming a silicon-containing polymer coating using the film-forming composition, a method for forming a silica-based coating using the film-forming composition, and a production method for the above-described silicon-containing polymer.

DETAILED DESCRIPTION OF THE INVENTION

«Silicon-Containing Polymer»

The silicon-containing polymer includes at least one of poly- or oligo-siloxane chain and poly- or oligo-silane chain in a molecular chain.

In the silicon-containing polymer, one or more groups represented by the following formula (1) are bound onto a silicon atom:

$$-R^1 - S - R^2 - \text{SiR}^3{}_n R^4{}_{(3-n)} \quad (1).$$

It is preferred that the group represented by the formula (1) be directly bound to a silicon atom in the poly- or oligo-siloxane chain or poly- or oligo-silane chain.

In the formula (1), $R^1$ and $R^2$ are each independently a hydrocarbon group having 1 or more and 10 or less carbon atoms. $R^3$ is a hydroxy group or a group to form a silanol group by hydrolysis. $R^4$ is an optionally substituted hydrocarbon group having 1 or more and 10 or less carbon atoms. n is an integer of 1 or more and 3 or less.

The silicon-containing polymer has a group represented by the above formula (1) and thus can be condensed with a hydroxy group on the surface of a substrate to form a covalent bond.

Therefore, a coated film which adheres well to the substrate and is not easily peeled off from the substrate can be formed by using a composition including a silicon-containing polymer having a group represented by the above formula (1). In addition, the groups represented by the above formula (1) can be condensed with each other. Therefore, a silicon-containing polymer having a group represented by the above formula (1) can also be used as a component for a hardening composition.

Because it is easy to produce a silicon-containing polymer and properties as polysilane and properties as polysiloxane are easily used, it is preferred that the whole molecular chain, particularly the whole main chain of a silicon-containing polymer include only poly- or oligo-siloxane chain or only poly- or oligo-silane chain.

The structure of the molecular chain of a silicon-containing polymer is not particularly limited. The structure of the molecular chain may have a linear structure, a branched chain structure, a network structure, or a cyclic structure. Because it is easy to control molecular weights and adjust various physical properties of a silicon-containing polymer, the structure of the molecular chain of a silicon-containing polymer is preferably linear, particularly the whole chain is preferably linear.

It should be noted that the silicon-containing polymer may be combined with a molecule having a different molecular chain structure. The silicon-containing polymer may include, for example, a combination of a linear molecule and a branched molecule.

The poly- or oligo-siloxane chain and poly- or oligo-silane chain will now be described.

<Poly- or Oligo-Siloxane Chain>

The structure of poly- or oligo-siloxane chain in a silicon-containing polymer is not particularly limited, so long as the silicon-containing polymer has a group represented by the above formula (1).

The poly- or oligo-siloxane chain is preferably, for example, poly- or oligo-siloxane chain obtained by hydrolytic condensation of at least one selected from silane compounds represented by the following formula (A1):

$$R_{4-m}\text{Si}(\text{OR}')_m \quad (A1)$$

In the formula (A1), R represents a hydrogen atom, a group represented by the above formula (1), an aliphatic hydrocarbon group, an aryl group, or an aralkyl group, R' represents an alkyl group or a phenyl group, and m represents an integer of 2 or more and 4 or less.

When a plurality of Rs are bound to Si, the plurality of Rs may be the same or different from each other. A plurality of (OR') groups bound to Si may also be the same or different from each other.

In addition, the aliphatic hydrocarbon group as R is preferably a linear or branched aliphatic hydrocarbon group having 1 or more and 20 or less carbon atoms, more preferably a linear or branched aliphatic hydrocarbon group having 1 or more and 4 or less carbon atoms. The aliphatic hydrocarbon group as R may have one or more, for example 1 or more and 3 or less, unsaturated bonds. As the aliphatic hydrocarbon group as R, for example, a methyl group, an ethyl group, an n-propyl group, an isopropyl group, an n-butyl group, an isobutyl group, a sec-butyl group, a tert-butyl group, a vinyl group, an allyl group, and the like are preferable.

When R is an aryl group or an aralkyl group, the aryl groups contained in these groups are not particularly limited, so long as the object of the present invention is not defeated. Suitable examples of the aryl group include the following groups.

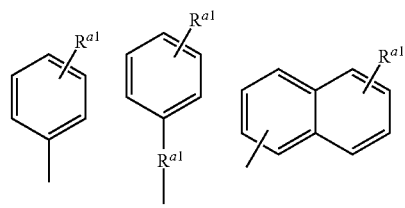

-continued

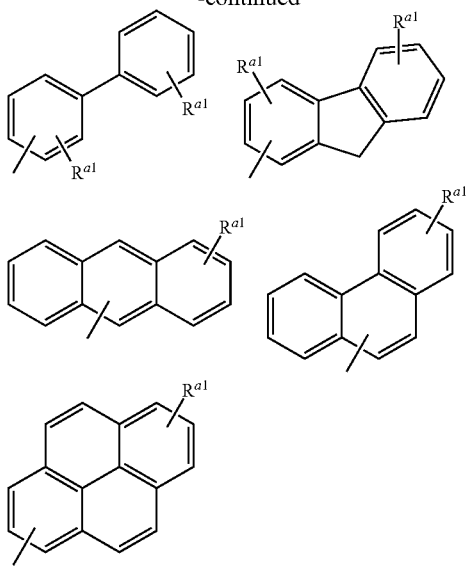

Among the groups represented by the above formulae, the groups represented by the following formulae are preferable.

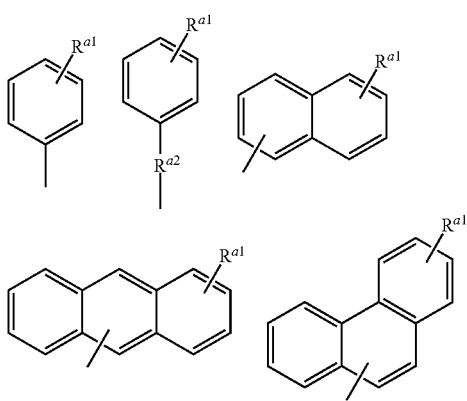

In the above formulae, $R^{a1}$ is a hydrogen atom; a hydroxy group; an alkoxy group such as a methoxy group, an ethoxy group, a butoxy group, or a propoxy group; or a hydrocarbon group including an alkyl group such as a methyl group, an ethyl group, a butyl group, or a propyl group. In the above formulae, $R^{a2}$ is an alkylene group such as a methylene group, an ethylene group, a propylene group, or a butylene group.

When R is an aryl group or an aralkyl group, suitable specific examples include a benzyl group, a phenethyl group, a phenyl group, a naphthyl group, an anthracenyl group, a phenanthryl group, a biphenylyl group, a fluorenyl group, a pyrenyl group, and the like.

The number of benzene rings in the aryl group or the aralkyl group is preferably 1 to 3. When the number of benzene rings is 1 to 3, it is easy to form a poly- or oligo-siloxane chain. The aryl group or the aralkyl group may have a hydroxy group as a substituent.

The alkyl group as R' is preferably a linear or branched alkyl group having 1 or more and 5 or less carbon atoms.

The number of carbon atoms in the alkyl group as R' is preferably 1 or 2, particularly in terms of the hydrolysis rate.

When m is 4 in the formula (A1), the resulting silane compound (i) is represented by the following formula (A2).

$$Si(OR^{41})_a(OR^{42})_b(OR^{43})_c(OR^{44})_d \quad (A2)$$

In the formula (A2), $R^{A1}$, $R^{A2}$, $R^{A3}$, and $R^{A4}$ each independently represent the same alkyl group or phenyl group as in R' above. a, b, c, and d are integers that satisfy $0 \le a \le 4$, $0 \le b \le 4$, $0 \le c \le 4$, $0 \le d \le 4$, and a+b+c+d=4.

When m is 3 in the formula (A1), the resulting silane compound (ii) is represented by the following formula (A3).

$$R^{45}Si(OR^{46})_e(OR^{47})_f(OR^{48})_g \quad (A3)$$

In the formula (A3), $R^{45}$ represents a hydrogen atom, a group represented by the above formula (1), or the same aliphatic hydrocarbon group, aryl group, or aralkyl group as in R above.

$R^{A6}$, $R^{A7}$, and $R^{A8}$ each independently represent the same alkyl group or phenyl group as in R' above. e, f, and g are integers that satisfy $0 \le e \le 3$, $0 \le f \le 3$, $0 \le g \le 3$, and e+f+g=3.

When m is 2 in the formula (A1), the resulting silane compound (iii) is represented by the following formula (A4).

$$R^{49}R^{410}Si(OR^{411})_h(OR^{412})_i \quad (A4)$$

In the formula (A4), $R^{49}$ and $R^{410}$ represent a hydrogen atom, a group represented by the above formula (1), or the same aliphatic hydrocarbon group, aryl group, or aralkyl group as in R above.

$R^{411}$ and $R^{412}$ each independently represent the same alkyl group or phenyl group as in R' above.

h and i are integers that satisfy $0 \le h \le 2$, $0 \le i \le 2$, and h+i=2.

Specific examples of the silane compound (i) include tetraalkoxysilanes such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane. Among these, tetramethoxysilane and tetraethoxysilane are preferable. Specific examples of the silane compound (ii) include hydrosilane compounds such as trimethoxysilane, triethoxysilane, tripropoxysilane, tripentyloxysilane, triphenyloxysilane, dimethoxymonoethoxysilane, diethoxymonomethoxysilane, dipropoxymonomethoxysilane, dipropoxymonoethoxysilane, dipentyloxylmonomethoxysilane, dipentyloxymonoethoxysilane, dipentyloxymonopropoxysilane, diphenyloxylmonomethoxysilane, diphenyloxymonoethoxysilane, diphenyloxymonopropoxysilane, methoxyethoxypropoxysilane, monopropoxydimethoxysilane, monopropoxydiethoxysilane, monobutoxydimethoxysilane, monopentyloxydiethoxysilane, and monophenyloxydiethoxysilane; methylsilane compounds such as methyltrimethoxysilane, methyltriethoxysilane, methyltripropoxysilane, methyltripentyloxysilane, methyltriphenyloxysilane, methylmonomethoxydiethoxysilane, methylmonomethoxydipropoxysilane, methylmonomethoxydipentyloxysilane, methylmonomethoxydiphenyloxysilane, methylmethoxyethoxypropoxysilane, and methylmonomethoxymonoethoxymonobutoxysilane; ethylsilane compounds such as ethyltrimethoxysilane, ethyltriethoxysilane, ethyltripropoxysilane, ethyltripentyloxysilane, ethyltriphenyloxysilane, ethylmonomethoxydiethoxysilane, ethylmonomethoxydipropoxysilane, ethylmonomethoxydipentyloxysilane, ethylmonomethoxydiphenyloxysilane, ethylmethoxyethoxypropoxysilane, and ethylmonomethoxymonoethoxymonobutoxysilane; propylsilane compounds such as propyltrimethoxysilane, propyltriethoxysilane, propyltripropoxysilane, propyltripentyloxysilane, and propyltriphenyloxysilane, propylmonomethoxydiethoxysilane, propylmonomethoxydipropoxysilane, propylmonomethoxydipentyloxysilane, propylmonomethoxydiphenyloxysilane, propylmethoxyethoxypropoxysilane, and propylmonomethoxymonoethoxymonobutoxysilane; butylsilane compounds such as butyltrimethoxysilane, butyltriethoxysilane, butyltripropoxysilane, butyltripentyloxysilane, butyltriphenyloxysilane, butylmonomethoxydiethoxysilane, butylmonomethoxydipropoxysilane, butylmonomethoxydipentyloxysilane, butylmonomethoxydiphenyloxysilane, butylmethoxyethoxypropoxysilane, and butylmonomethoxymonoethoxymonobutoxysilane; phenylsilane compounds such as phenyltrimethoxysilane, phenyltriethoxysilane, phenyltripropoxysilane, phenyltripentyloxysilane, phenyltriphenyloxysilane, phenylmonomethoxydiethoxysilane, phenylmonomethoxydipropoxysilane, phenylmonomethoxydipentyloxysilane, phenylmonomethoxydiphenyloxysilane, phenylmethoxyethoxypropoxysilane, and phenylmonomethoxymonoethoxymonobutoxysilane; hydroxyphenylsilane compounds such as hydroxyphenyltrimethoxysilane, hydroxyphenyltriethoxysilane, hydroxyphenyltripropoxysilane, hydroxyphenyltripentyloxysilane, hydroxyphenyltriphenyloxysilane, hydroxyphenylmonomethoxydiethoxysilane, hydroxyphenylmonomethoxydipropoxysilane, hydroxyphenylmonomethoxydipentyloxysilane, hydroxyphenylmonomethoxydiphenyloxysilane, hydroxyphenylmethoxyethoxypropoxysilane, and hydroxyphenylmonomethoxymonoethoxymonobutoxysilane; naphthylsilane compounds such as naphthyltrimethoxysilane, naphthyltriethoxysilane, naphthyltripropoxysilane, naphthyltripentyloxysilane, naphthyltriphenyloxysilane, naphthylmonomethoxydiethoxysilane, naphthylmonomethoxydipropoxysilane, naphthylmonomethoxydipentyloxysilane, naphthylmonomethoxydiphenyloxysilane, naphthylmethoxyethoxypropoxysilane, and naphthylmonomethoxymonoethoxymonobutoxysilane; benzylsilane compounds such as benzyltrimethoxysilane, benzyltriethoxysilane, benzyltripropoxysilane, benzyltripentyloxysilane, benzyltriphenyloxysilane, benzylmonomethoxydiethoxysilane, benzylmonomethoxydipropoxysilane, benzylmonomethoxydipentyloxysilane, benzylmonomethoxydiphenyloxysilane, benzylmethoxyethoxypropoxysilane, and benzylmonomethoxymonoethoxymonobutoxysilane; hydroxybenzylsilane compounds such as hydroxybenzyltrimethoxysilane, hydroxybenzyltriethoxysilane, hydroxybenzyltripropoxysilane, hydroxybenzyltripentyloxysilane, hydroxybenzyltriphenyloxysilane, hydroxybenzylmonomethoxydiethoxysilane, hydroxybenzylmonomethoxydipropoxysilane, hydroxybenzylmonomethoxydipentyloxysilane, hydroxybenzylmonomethoxydiphenyloxysilane, hydroxybenzylmethoxyethoxypropoxysilane, and hydroxybenzylmonomethoxymonoethoxymonobutoxy silane; vinylsilane compounds such as vinyltrimethoxysilane, vinyltriethoxysilane, vinyltripropoxysilane, vinyltripentyloxysilane, vinyltriphenyloxysilane, vinylmonomethoxydiethoxysilane, vinylmonomethoxydipropoxysilane, vinylmonomethoxydipentyloxysilane, vinylmonomethoxydiphenyloxysilane, vinylmethoxyethoxypropoxysilane, and vinylmonomethoxymonoethoxymonobutoxysilane; and allylsilane compounds such as allyltrimethoxysilane, allyltriethoxysilane, allyltripropoxysilane, allyltripentyloxysilane, allyltriphenyloxysilane, allylmonomethoxydiethoxysilane, allylmonomethoxydipropoxysilane, allylmonomethoxydipentyloxysilane, allylmonomethoxydiphenyloxysilane, allylmethoxyethoxypropoxysilane, and allylmonomethoxymonoethoxymonobutoxysilane.

Compounds obtained by substituting a methyl group, an ethyl group, a propyl group, a butyl group, a hydroxyphenyl group, a naphthyl group, a benzyl group, a hydroxybenzyl group, a vinyl group, or an allyl group in the above compounds with a group represented by the above formula (1) are also preferable as the silane compound (ii).

Specific examples of the silane compound (iii) include hydrosilane compounds such as dimethoxysilane, diethoxysilane, dipropoxysilane, dipentyloxysilane, diphenyloxysilane, methoxyethoxysilane, methoxypropoxysilane, methoxypentyloxysilane, methoxyphenyloxysilane, ethoxypropoxysilane, ethoxypentyloxysilane, and ethoxyphenyloxysilane;

methylhydrosilane compounds such as methyldimethoxysilane, methylmethoxyethoxysilane, methyldiethoxysilane, methylmethoxypropoxysilane, methylmethoxypentyloxysilane, methylethoxypropoxysilane, methyldipropoxysilane, methyldipentyloxysilane, methyldiphenyloxysilane, and methylmethoxyphenyloxysilane;

ethylhydrosilane compounds such as ethyldimethoxysilane, ethylmethoxyethoxysilane, ethyldiethoxysilane, ethylmethoxypropoxysilane, ethylmethoxypentyloxysilane, ethylethoxypropoxysilane, ethyldipropoxysilane, ethyldipentyloxysilane, ethyldiphenyloxysilane, and ethylmethoxyphenyloxysilane;

propylhydrosilane compounds such as propyldimethoxysilane, propylmethoxyethoxysilane, propyldiethoxysilane, propylmethoxypropoxysilane, propylmethoxypentyloxysilane, propylethoxypropoxysilane, propyldipropoxysilane, propyldipentyloxysilane, propyldiphenyloxysilane, and propylmethoxyphenyloxysilane;

butylhydrosilane compounds such as butyldimethoxysilane, butylmethoxyethoxysilane, butyldiethoxysilane, butylmethoxypropoxysilane, butylmethoxypentyloxysilane, butylethoxypropoxysilane, butyldipropoxysilane, butyldipentyloxysilane, butyldiphenyloxysilane, and butylmethoxyphenyloxysilane;

phenylhydrosilane compounds such as phenyldimethoxysilane, phenylmethoxyethoxysilane, phenyldiethoxysilane, phenylmethoxypropoxysilane, phenylmethoxypentyloxysilane, phenylethoxypropoxysilane, phenyldipropoxysilane, phenyldipentyloxysilane, phenyldiphenyloxysilane, and phenylmethoxyphenyloxysilane;

hydroxyphenylhydrosilane compounds such as hydroxyphenyldimethoxysilane, hydroxyphenylmethoxyethoxysilane, hydroxyphenyldiethoxysilane, hydroxyphenylmethoxypropoxysilane, hydroxyphenylmethoxypentyloxysilane, hydroxyphenylethoxypropoxysilane, hydroxyphenyldipropoxysilane, hydroxyphenyldipentyloxysilane, hydroxyphenyldiphenyloxysilane, and hydroxyphenylmethoxyphenyloxysilane;

naphthylhydrosilane compounds such as naphthyldimethoxysilane, naphthylmethoxyethoxysilane, naphthyldiethoxysilane, naphthylmethoxypropoxysilane, naphthylmethoxypentyloxysilane, naphthylethoxypropoxysilane, naphthyldipropoxysilane, naphthyldipentyloxysilane, naphthyldiphenyloxysilane, and naphthylmethoxyphenyloxysilane;

benzylhydrosilane compounds such as benzyldimethoxysilane, benzylmethoxyethoxysilane, benzyldiethoxysilane, benzylmethoxypropoxysilane, benzylmethoxypentyloxysilane, benzylethoxypropoxysilane, benzyldipropoxysilane, benzyldipentyloxysilane, benzyldiphenyloxysilane, and benzylmethoxyphenyloxysilane;

hydroxybenzylhydrosilane compounds such as hydroxybenzyldimethoxysilane, hydroxybenzylmethoxyethoxysilane, hydroxybenzyldiethoxysilane, hydroxybenzylmethoxypropoxysilane, hydroxybenzylmethoxypentyloxysilane, hydroxybenzylethoxypropoxysilane, hydroxybenzyldipropoxysilane, hydroxybenzyldipentyloxysilane, hydroxybenzyldiphenyloxysilane, and hydroxybenzylmethoxyphenyloxysilane;

dimethylsilane compounds such as dimethyldimethoxysilane, dimethylmethoxyethoxysilane, dimethylmethoxypropoxysilane, dimethyldiethoxysilane, dimethyldipentyloxysilane, dimethyldiphenyloxysilane, dimethylethoxypropoxysilane, and dimethyldipropoxysilane;

diethylsilane compounds such as diethyldimethoxysilane, diethylmethoxyethoxysilane, diethylmethoxypropoxysilane, diethyldiethoxysilane, diethyldipentyloxysilane, diethyldiphenyloxysilane, diethylethoxypropoxysilane, and diethyldipropoxysilane;

dipropoxysilane compounds such as dipropyldimethoxysilane, dipropylmethoxyethoxysilane, dipropylmethoxypropoxysilane, dipropyldiethoxysilane, dipropyldipentyloxysilane, dipropyldiphenyloxysilane, dipropylethoxypropoxysilane, and dipropyldipropoxysilane;

dibutylsilane compounds such as dibutyldimethoxysilane, dibutylmethoxyethoxysilane, dibutylmethoxypropoxysilane, dibutyldiethoxysilane, dibutyldipentyloxysilane, dibutyldiphenyloxysilane, dibutylethoxypropoxysilane, and dibutyldipropoxysilane;

diphenylsilane compounds such as diphenyldimethoxysilane, diphenylmethoxyethoxysilane, diphenylmethoxypropoxysilane, diphenyldiethoxysilane, diphenyldipentyloxysilane, diphenyldiphenyloxysilane, diphenylethoxypropoxysilane, and diphenyldipropoxysilane;

di(hydroxyphenyl)silane compounds such as di(hydroxyphenyl)dimethoxysilane, di(hydroxyphenyl)methoxyethoxysilane, di(hydroxyphenyl)methoxypropoxysilane, di(hydroxyphenyl)diethoxysilane, di(hydroxyphenyl)dipentyloxysilane, di(hydroxyphenyl)diphenyloxysilane, di(hydroxyphenyl)ethoxypropoxysilane, and di(hydroxyphenyl)dipropoxysilane;

dinaphthylsilane compounds such as dinaphthyldimethoxysilane, dinaphthylmethoxyethoxysilane, dinaphthylmethoxypropoxysilane, dinaphthyldiethoxysilane, dinaphthyldipentyloxysilane, dinaphthyldiphenyloxysilane, dinaphthylethoxypropoxysilane, and dinaphthyldipropoxysilane;

dibenzylsilane compounds such as dibenzyldimethoxysilane, dibenzylmethoxyethoxysilane, dibenzylmethoxypropoxysilane, dibenzyldiethoxysilane, dibenzyldipentyloxysilane, dibenzyldiphenyloxysilane, dibenzylethoxypropoxysilane, and dibenzyldipropoxysilane;

di(hydroxybenzyl)silane compounds such as di(hydroxybenzyl)dimethoxysilane, di(hydroxybenzyl)methoxyethoxysilane, di(hydroxybenzyl)methoxypropoxysilane, di(hydroxybenzyl)diethoxysilane, di(hydroxybenzyl)dipentyloxysilane, di(hydroxybenzyl)diphenyloxysilane, di(hydroxybenzyl)ethoxypropoxysilane, and di(hydroxybenzyl)dipropoxysilane;

methylethylsilane compounds such as methylethyldimethoxysilane, methylethylmethoxyethoxysilane, methylethylmethoxypropoxysilane, methylethyldiethoxysilane, methylethyldipentyloxysilane, methylethyldiphenyloxysilane, methylethylethoxypropoxysilane, and methylethyldipropoxysilane;

methylpropylsilane compounds such as methylpropyldimethoxysilane, methylpropylmethoxyethoxysilane, methylpropylmethoxypropoxysilane, methylpropyldiethoxysilane, methylpropyldipentyloxysilane, methylpropyldiphenyloxysilane, methylpropylethoxypropoxysilane, and methylpropyldipropoxysilane;

methylbutylsilane compounds such as methylbutyldimethoxysilane, methylbutylmethoxyethoxysilane, methylbutylmethoxypropoxysilane, methylbutyldiethoxysilane, methylbutyldipentyloxysilane, methylbutyldiphenyloxysilane, methylbutylethoxypropoxysilane, and methylbutyldipropoxysilane;

methyl(phenyl)silane compounds such as methyl(phenyl)dimethoxysilane, methyl(phenyl)methoxyethoxysilane, methyl(phenyl)methoxypropoxysilane, methyl(phenyl)diethoxysilane, methyl(phenyl)dipentyloxysilane, methyl(phenyl)diphenyloxysilane, methyl(phenyl)ethoxypropoxysilane, and methyl(phenyl)dipropoxysilane;

methyl(hydroxyphenyl)silane compounds such as methyl(hydroxyphenyl)dimethoxysilane, methyl(hydroxyphenyl)methoxyethoxysilane, methyl(hydroxyphenyl)methoxypropoxysilane, methyl(hydroxyphenyl)diethoxysilane, methyl(hydroxyphenyl)dipentyloxysilane, methyl(hydroxyphenyl)diphenyloxysilane, methyl(hydroxyphenyl)ethoxypropoxysilane, and methyl(hydroxyphenyl)dipropoxysilane;

methyl(naphthyl)silane compounds such as methyl(naphthyl)dimethoxysilane, methyl(naphthyl)methoxyethoxysilane, methyl(naphthyl)methoxypropoxysilane, methyl(naphthyl)diethoxysilane, methyl(naphthyl)dipentyloxysilane, methyl(naphthyl)diphenyloxysilane, methyl(naphthyl)ethoxypropoxysilane, and methyl(naphthyl)dipropoxysilane;

methyl(benzyl)silane compounds such as methyl(benzyl)dimethoxysilane, methyl(benzyl)methoxyethoxysilane, methyl(benzyl)methoxypropoxysilane, methyl(benzyl)diethoxysilane, methyl(benzyl)dipentyloxysilane, methyl(benzyl)diphenyloxysilane, methyl(benzyl)ethoxypropoxysilane, and methyl(benzyl)dipropoxysilane;

methyl(hydroxybenzyl)silane compounds such as methyl(hydroxybenzyl)dimethoxysilane, methyl(hydroxybenzyl)methoxyethoxysilane, methyl(hydroxybenzyl)methoxypropoxysilane, methyl(hydroxybenzyl)diethoxysilane, methyl(hydroxybenzyl)dipentyloxysilane, methyl(hydroxybenzyl)diphenyloxysilane, methyl(hydroxybenzyl)ethoxypropoxysilane, and methyl(hydroxybenzyl)dipropoxysilane;

ethylpropylsilane compounds such as ethylpropyldimethoxysilane, ethylpropylmethoxyethoxysilane, ethylpropylmethoxypropoxysilane, ethylpropyldiethoxysilane, ethylpropyldipentyloxysilane, ethylpropyldiphenyloxysilane, ethylpropylethoxypropoxysilane, and ethylpropyldipropoxysilane;

ethylbutylsilane compounds such as ethylbutyldimethoxysilane, ethylbutylmethoxyethoxysilane, ethylbutylmethoxypropoxysilane, ethylbutyldiethoxysilane, ethyl-butyldipentyloxysilane, ethylbutyldiphenyloxysilane, ethylbutylethoxypropoxysilane, and ethylbutyldipropoxysilane;

ethyl(phenyl)silane compounds such as ethyl(phenyl)dimethoxysilane, ethyl(phenyl)methoxyethoxysilane, ethyl(phenyl)methoxypropoxysilane, ethyl(phenyl)diethoxysilane, ethyl(phenyl)dipentyloxysilane, ethyl(phenyl)diphenyloxysilane, ethyl(phenyl)ethoxypropoxysilane, and ethyl(phenyl)dipropoxysilane;

ethyl(hydroxyphenyl)silane compounds such as ethyl(hydroxyphenyl)dimethoxysilane, ethyl(hydroxyphenyl)methoxyethoxysilane, ethyl(hydroxyphenyl)methoxypropoxysilane, ethyl(hydroxyphenyl)diethoxysilane, ethyl(hydroxyphenyl)dipentyloxysilane, ethyl(hydroxyphenyl)diphenyloxysilane, ethyl(hydroxyphenyl)ethoxypropoxysilane, and ethyl(hydroxyphenyl)dipropoxysilane;

ethyl(naphthyl)silane compounds such as ethyl(naphthyl)dimethoxysilane, ethyl(naphthyl)methoxyethoxysilane, ethyl(naphthyl)methoxypropoxysilane, ethyl(naphthyl)diethoxysilane, ethyl(naphthyl)dipentyloxysilane, ethyl(naphthyl)diphenyloxysilane, ethyl(naphthyl)ethoxypropoxysilane, and ethyl(naphthyl)dipropoxysilane;

ethyl(benzyl)silane compounds such as ethyl(benzyl)dimethoxysilane, ethyl(benzyl)methoxyethoxysilane, ethyl(benzyl)methoxypropoxysilane, ethyl(benzyl)diethoxysilane, ethyl(benzyl)dipentyloxysilane, ethyl(benzyl)diphenyloxysilane, ethyl(benzyl)ethoxypropoxysilane, and ethyl(benzyl)dipropoxysilane;

ethyl(hydroxybenzyl)silane compounds such as ethyl(hydroxybenzyl)dimethoxysilane, ethyl(hydroxybenzyl)methoxyethoxysilane, ethyl(hydroxybenzyl)methoxypropoxysilane, ethyl(hydroxybenzyl)diethoxysilane, ethyl(hydroxybenzyl)dipentyloxysilane, ethyl(hydroxybenzyl)diphenyloxysilane, ethyl(hydroxybenzyl)ethoxypropoxysilane, and ethyl(hydroxybenzyl)dipropoxysilane;

propylbutylsilane compounds such as propylbutyldimethoxysilane, propylbutylmethoxyethoxysilane, propylbutylmethoxypropoxysilane, propylbutyldiethoxysilane, propylbutyldipentyloxysilane, propylbutyldiphenyloxysilane, propylbutylethoxypropoxysilane, and propylbutyldipropoxysilane;

propyl(phenyl)silane compounds such as propyl(phenyl)dimethoxysilane, propyl(phenyl)methoxyethoxysilane, propyl(phenyl)methoxypropoxysilane, propyl(phenyl)diethoxysilane, propyl(phenyl)dipentyloxysilane, propyl(phenyl)diphenyloxysilane, propyl(phenyl)ethoxypropoxysilane, and propyl(phenyl)dipropoxysilane;

propyl(hydroxyphenyl)silane compounds such as propyl(hydroxyphenyl)dimethoxysilane, propyl(hydroxyphenyl)methoxyethoxysilane, propyl(hydroxyphenyl)methoxypropoxysilane, propyl(hydroxyphenyl)diethoxysilane, propyl(hydroxyphenyl)dipentyloxysilane, propyl(hydroxyphenyl)diphenyloxysilane, propyl(hydroxyphenyl)ethoxypropoxysilane, and propyl(hydroxyphenyl)dipropoxysilane;

propyl(naphthyl)silane compounds such as propyl(naphthyl)dimethoxysilane, propyl(naphthyl)methoxyethoxysilane, propyl(naphthyl)methoxypropoxysilane, propyl(naphthyl)diethoxysilane, propyl(naphthyl)dipentyloxysilane, propyl(naphthyl)diphenyloxysilane, propyl(naphthyl)ethoxypropoxysilane, and propyl(naphthyl)dipropoxysilane;

propyl(benzyl)silane compounds such as propyl(benzyl)dimethoxysilane, propyl(benzyl)methoxyethoxysilane, propyl(benzyl)methoxypropoxysilane, propyl(benzyl)diethoxysilane, propyl(benzyl)dipentyloxysilane, propyl(benzyl)diphenyloxysilane, propyl(benzyl)ethoxypropoxysilane, and propyl(benzyl)dipropoxysilane;

propyl(hydroxybenzyl)silane compounds such as propyl(hydroxybenzyl)dimethoxysilane, propyl(hydroxybenzyl)methoxyethoxysilane, propyl(hydroxybenzyl)methoxypropoxysilane, propyl(hydroxybenzyl)diethoxysilane, propyl(hydroxybenzyl)dipentyloxysilane, propyl(hydroxybenzyl)diphenyloxysilane, propyl(hydroxybenzyl)ethoxypropoxysilane, and propyl(hydroxybenzyl)dipropoxysilane;

divinylsilane compounds such as divinyldimethoxysilane, divinylmethoxyethoxysilane, divinylmethoxypropoxysilane, divinyldiethoxysilane, divinyldipentyloxysilane, divinyldiphenyloxysilane, divinylethoxypropoxysilane, and divinyldipropoxysilane;

vinylmethylsilane compounds such as vinylmethyldimethoxysilane, vinylmethylmethoxyethoxysilane, vinylmethylmethoxypropoxysilane, vinylmethyldiethoxysilane, vinylmethyldipentyloxysilane, vinylmethyldiphenyloxysilane, vinylmethylethoxypropoxysilane, and vinylmethyldipropoxysilane;

vinylethylsilane compounds such as vinylethyldimethoxysilane, vinylethylmethoxyethoxysilane, vinylethylmethoxypropoxysilane, vinylethyldiethoxysilane, vinylethyldipentyloxysilane, vinylmethyldiphenyloxysilane, vinylethylethoxypropoxysilane, and vinylethyldipropoxysilane;

vinyl(phenyl)silane compounds such as vinyl(phenyl)dimethoxysilane, vinyl(phenyl)methoxyethoxysilane, vinyl(phenyl)methoxypropoxysilane, vinyl(phenyl)diethoxysilane, vinyl(phenyl)dipentyloxysilane, vinyl(phenyl)diphenyloxysilane, vinyl(phenyl)ethoxypropoxysilane, and vinyl(phenyl)dipropoxysilane;

diallylsilane compounds such as diallyldimethoxysilane, diallylmethoxyethoxysilane, diallylmethoxypropoxysilane, diallyldiethoxysilane, diallyldipentyloxysilane, diallyldiphenyloxysilane, diallylethoxypropoxysilane, and diallyldipropoxysilane;

allylmethylsilane compounds such as allylmethyldimethoxysilane, allylmethylmethoxyethoxysilane, allylmethylmethoxypropoxysilane, allylmethyldiethoxysilane, allylmethyldipentyloxysilane, allylmethyldiphenyloxysilane, allylmethylethoxypropoxysilane, and allylmethyldipropoxysilane;

allylethylsilane compounds such as allylethyldimethoxysilane, allylethylmethoxyethoxysilane, allylethylmethoxypropoxysilane, allylethyldiethoxysilane, allylethyldipentyloxysilane, allylmethyldiphenyloxysilane, allylethylethoxypropoxysilane, and allylethyldipropoxysilane;

allyl(phenyl)silane compounds such as allyl(phenyl)dimethoxysilane, allyl(phenyl)methoxyethoxysilane, allyl(phenyl)methoxypropoxysilane, allyl(phenyl)diethoxysilane, allyl(phenyl)dipentyloxysilane, allyl(phenyl)diphenyloxysilane, allyl(phenyl)ethoxypropoxysilane, and allyl(phenyl)dipropoxysilane.

Compounds obtained by substituting at least one of methyl groups, ethyl groups, propyl groups, butyl groups, hydroxyphenyl groups, naphthyl groups, benzyl groups, hydroxybenzyl groups, vinyl groups, and allyl groups in the above compounds with a group represented by the above formula (1) are also preferable as the silane compound (iii).

By subjecting a silane compound described above to hydrolytic condensation by a conventional procedure, the poly- or oligo-siloxane chain is formed.

As the poly- or oligo-siloxane chain, a siloxane chain including a unit represented by the following formula (A3-1) and/or a unit represented by the following formula (A4-1) is preferable, and a linear siloxane chain including a unit represented by the formula (A4-1) is more preferable:

  (A3-1)

  (A4-1)

In the formula (A3-1) and the formula (A4-1), $R^{A13}$, $R^{A14}$, and $R^{A15}$ are each independently a group represented by the above formula (1), a linear or branched alkyl group having 1 or more and 4 or less carbon atoms, or a phenyl group, and at least one of $R^{A13}$, $R^{A14}$, and $R^{A15}$ is preferably a group represented by the above formula (1).

<Poly- or Oligo-Silane Chain>

The structure of poly- or oligo-silane chain in a silicon-containing polymer is not particularly limited, so long as the silicon-containing polymer has a group represented by the above formula (1). The poly- or oligo-silane chain may include a silanol group and/or an alkoxy group.

The poly- or oligo-silane chain is preferably formed from, for example, at least one of units represented by the following formulae (A5) to (A7):

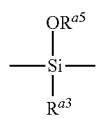  (A5)

  (A6)

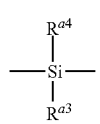  (A7)

  (A8)

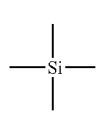  (A9)

(In the formulae (A5), (A7), and (A8), $R^{a3}$ and $R^{a4}$ each represent a hydrogen atom, an organic group, or a silyl group. $R^{a5}$ represents a hydrogen atom or an alkyl group. When $R^{a5}$ is an alkyl group, an alkyl group having 1 or more and 4 or less carbon atoms is preferable, a methyl group and an ethyl group are more preferable.)

Examples of the organic groups as $R^{a3}$ and $R^{a4}$ include a group represented by the above-described formula (1), hydrocarbon groups such as an alkyl group, an alkenyl group, a cycloalkyl group, a cycloalkenyl group, an aryl group, and an aralkyl group, an alkoxy group, an alkenyloxy group, a cycloalkoxy group, a cycloalkenyloxy group, an aryloxy group, and an aralkyloxy group, and the like.

Among these groups, a group represented by the above-described formula (1), an alkyl group, an aryl group, and an aralkyl group are preferable. Suitable examples of the alkyl group, aryl group and aralkyl group are the same as in the case where R is an alkyl group, an aryl group, or an aralkyl group in the above-described formula (A1).

When $R^{a3}$ and $R^{a4}$ are each a silyl group, examples of the silyl group include a silyl group and $Si_{1-10}$ silanyl groups (such as $Si_{1-6}$ silanyl groups) such as a disilanyl group and a trisilanyl group. The poly- or oligo-silane chain preferably includes units of the following formulae (A10) to (A13).

  (A10)

  (A11)

  (A12)

  (A13)

In (A10) to (A13), $R^{a3}$ and $R^{a4}$ are the same as $R^{a3}$ and $R^{a4}$ in the formulae (A5), (A7), and (A8). Each of a, b, and c is an integer of 2 to 1000.

Each of a, b, and c is preferably 10 to 500, more preferably 10 to 100. The building block in each unit may be present in the unit either in a random manner or in a blocked state.

Among the poly- or oligo-silane chains described above, poly- or oligo-silane chain including a combination of a group represented by the formula (1), an alkyl group, and an aryl group or an aralkyl group, each bound to a silicon atom, and poly- or oligo-silane chain including a combination of a group represented by the formula (1) and an alkyl group, each bound to a silicon atom, are preferable.

More specifically, poly- or oligo-silane chain including a combination of a group represented by the formula (1), a methyl group, and a benzyl group each bound to a silicon atom, poly- or oligo-silane chain including a combination of a group represented by the formula (1), a methyl group, and a phenyl group, each bound to a silicon atom, poly- or oligo-silane chain including a combination of a group represented by the formula (1) and a methyl group, each bound to a silicon atom, and poly- or oligo-silane chain including only groups represented by the formula (1), each bound to a silicon atom, are preferably used. It is preferred that the above groups bound to a silicon atom be directly bound to the silicon atom.

<Group Represented by Formula (1)>

The silicon-containing polymer has a group represented by the formula (1) and thus provides a coated film which attaches well to a substrate.

When forming a coated film using a composition including a silicon-containing polymer, the number of moles of a group represented by the formula (1) in the silicon-containing polymer is preferably 0.05 mol or more and 2.0 mol or less and more preferably 0.2 mol or more and 1.0 mol or less with respect to 1 mol of silicon atom in the silicon-containing polymer because the adhesive properties of the coated film to a substrate are favorable.

The hydrocarbon groups as $R^1$ and $R^2$ in the above formula (1) are not particularly limited, so long as the number of carbon atoms is 1 or more and 10 or less. The hydrocarbon group as $R^1$ may be an aliphatic hydrocarbon group, an aromatic hydrocarbon group, or a combination of an aliphatic hydrocarbon group and an aromatic hydrocarbon group.

In cases where the hydrocarbon groups as $R^1$ and $R^2$ are an aliphatic hydrocarbon group and the hydrocarbon groups as $R^1$ and $R^2$ include an aliphatic hydrocarbon group, the aliphatic hydrocarbon group may be linear or branched or include a cyclic skeleton. From the viewpoint that raw materials are easily acquired and the viewpoint that the alkali-solubility of a silicon-containing polymer is particularly favorable, the hydrocarbon groups as $R^1$ and $R^2$ are preferably a linear or branched hydrocarbon group, and more preferably a linear hydrocarbon group.

Because it is easy to acquire raw materials and synthesize a silicon-containing polymer, n is preferably 1. $R^2$ is preferably a divalent hydrocarbon group.

Specific examples of the hydrocarbon groups as $R^1$ and $R^2$ include a methylene group, an ethane-1,2-diyl group, an ethane-1,1-diyl group, a propane-1,3-diyl group, a propane-1,2-diyl group, a propane-1,1-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a cyclohexane-1,4-diyl group, a cyclohexane-1,3-diyl group, a cyclohexane-1,2-diyl group, a p-phenylene group, a m-phenylene group, an o-phenylene group, a naphthalene-2,6-diyl group, a naphthalene-2,7-diyl group, and a naphthalene-1,4-diyl group, and the like.

Among the above hydrocarbon groups as $R^1$ and $R^2$, a methylene group, an ethane-1,2-diyl group, a propane-1,3-diyl group, a p-phenylene group, and a m-phenylene group are preferable, and an ethane-1,2-diyl group, and a propane-1,3-diyl group are more preferable.

As the group represented by the formula (1), groups represented by the following formulae (1a) to (1d) are preferable:

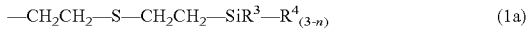

$$—CH_2CH_2—S—CH_2CH_2—SiR^3{}_n R^4{}_{(3-n)} \quad (1a)$$

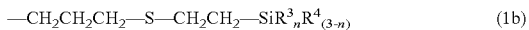

$$—CH_2CH_2CH_2—S—CH_2CH_2—SiR^3{}_n R^4{}_{(3-n)} \quad (1b)$$

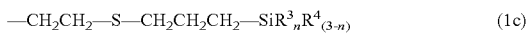

$$—CH_2CH_2—S—CH_2CH_2CH_2—SiR^3{}_n R^4{}_{(3-n)} \quad (1c)$$

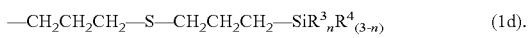

$$—CH_2CH_2CH_2—S—CH_2CH_2CH_2—SiR^3{}_n R^4{}_{(3-n)} \quad (1d).$$

In the formula (1), $R^3$ is a hydroxy group or a group to form a silanol group by hydrolysis. $R^4$ is an optionally substituted hydrocarbon group having 1 or more and 10 or less carbon atoms. n is an integer of 1 or more and 3 or less.

Examples of the group to form a silanol group by hydrolysis as $R^3$ include an alkoxy group, an isocyanate group, a dimethylamino group, a halogen atom, and the like. As the alkoxy group, a linear or branched aliphatic alkoxy group having 1 or more and 5 or less carbon atoms is preferable. Suitable specific examples of the alkoxy group include a methoxy group, an ethoxy group, an n-propoxy group, an isopropoxy group, an n-butoxy group, and the like. As the halogen atom, a chlorine atom, a fluorine atom, a bromine atom and an iodine atom are preferable, and a chlorine atom is more preferable.

As the group to form a silanol group by hydrolysis, an isocyanate group and a linear or branched aliphatic alkoxy group having 1 or more and 5 or less carbon atoms are preferable, an alkoxy group having 1 or more and 4 or less carbon atoms is more preferable, and a methoxy group, an ethoxy group, and an isocyanate group are particularly preferable because they are easily and quickly hydrolyzed and it is easy to prepare a silicon-containing polymer having a group represented by the formula (1).

Examples of the optionally substituted hydrocarbon group as $R^4$ include an unsubstituted hydrocarbon group, a halogenated hydrocarbon group, an alkoxyalkyl group, and the like. Among these, an unsubstituted hydrocarbon group is preferable. When a hydrocarbon group has a substituent, the substituent is not particularly limited, so long as the object of the present invention is not defeated.

Suitable examples of the unsubstituted hydrocarbon group include an alkyl group, an alkenyl group, a cycloalkyl group, an aralkyl group, and an aryl group.

Specific examples of the alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, an n-decyl group, and the like.

Specific examples of the alkenyl group include a vinyl group, an allyl group, a 3-butenyl group, a 4-pentenyl group, a 5-hexenyl group, a 6-heptenyl group, a 7-octenyl group, an 8-nonenyl group, and a 9-decenyl group.

Specific examples of the cycloalkyl group include a cyclopropyl group, a cyclobutyl group, a cyclopentyl group, a cyclohexyl group, a cycloheptyl group, a cyclooctyl group, a cyclononyl group, a cyclodecyl group, and the like.

Specific examples of the aralkyl group include a benzyl group, a phenethyl group, and the like.

Specific examples of the aryl group include a phenyl group, a naphthalen-1-yl group, a naphthalen-2-yl group, and the like.

$R^4$ is preferably an alkyl group having 1 or more and 4 or less carbon atoms, more preferably an alkyl group having 1 or more and 3 or less carbon atoms, and particularly preferably a methyl group or an ethyl group.

n is an integer of 1 or more and 3 or less. n is preferably 2 or 3, and more preferably 3 from the viewpoint of the reactivity of a group represented by the formula (1).

The weight average molecular weight (Mw) of a silicon-containing polymer described above, and the dispersion degree (Mw/Mn), the ratio of weight average molecular weight (Mw) and number average molecular weight (Mn), are not particularly limited. The weight average molecular weight is preferably 500 or more and 12000 or less, more preferably 1500 or more and 8000 or less, and further preferably 2500 or more and 7000 or less because the silicon-containing polymer has good film-forming properties.

The dispersion degree is preferably 1 or more and 4.5 or less, and more preferably 2 or more and 4 or less.

«Film-Forming Composition»

A composition including the above-described silicon-containing polymer (A) and a solvent (S) is useful as a film-forming composition. By applying such a film-forming composition, a film including the silicon-containing polymer (A) as the main component can be formed. The applications of the film including the silicon-containing polymer (A) as the main component are not particularly limited. A silica-based coating can be formed, for example, by baking the film including the silicon-containing polymer (A) as the main component.

<Silicon-Containing Polymer (A)>

The silicon-containing polymer (A) is as described above. The silicon-containing polymer (A) content in the film-forming composition is not particularly limited and may be set depending on the desired film thickness. From the viewpoint of film-forming properties, the silicon-containing polymer (A) content in the film-forming composition is preferably 1 mass % or more and 50 mass % or less, more preferably 5 mass % or more and 40 mass % or less, and particularly preferably 10 mass % or more and 35 mass % or less. From the viewpoint of conformal properties, it is preferably 0.05 mass % or more and 20 mass % or less, more preferably 0.1 mass % or more and 10 mass % or less, and more preferably 0.5 mass % or more and 3 mass % or less.

<Curing Agent (B)>

The film-forming composition may include a curing agent (B). When the film-forming composition includes a curing agent (B), it is easy to form a silica-based coating that has a low dielectric constant and excellent resistance to organic solvents, and therefore is not readily dissolved, swollen, or deformed by the action of an organic solvent such as N-methyl-2-pyrrolidone. Suitable examples of the curing agent (B) include Bronsted acids such as hydrochloric acid, sulfuric acid, nitric acid, benzenesulfonic acid, and p-toluenesulfonic acid; imidazoles such as 2-methylimidazole and 2-ethyl-4-methylimidazole; organic amines such as 2,4,6-tris(dimethylaminomethyl)phenol, benzylmethylamine, DBU (1,8-diazabicyclo[5.4.0]-7-undecene), and DCMU (3-(3,4-dichlorophenyl)-1,1-dimethylurea); organophosphorus compounds such as tributylphosphine, triphenylphosphine, tris(p-tolyl)phosphine, tris(m-tolyl)phosphine, tris(o-tolyl)phosphine, diphenylcyclohexylphosphine, tricyclohexylphosphine, tris(dimethoxyphenyl)phosphine, ethyltriphenylphosphonium bromide, benzyltriphenylphosphonium chloride, and 1,4-bisdiphenylphosphinobutane; organophosphorus compound complexes such as triphenylphosphine triphenylborane, tetraphenylphosphonium tetra-p-tolyl borate, tetraphenylphosphonium tetraphenyl borate, tetraphenylphosphonium thiocyanate, tetraphenylphosphonium dicyanamide, and n-butyltriphenylphosphonium dicyanamide; complexes of a Lewis acid such as boron trifluoride and an organic amine (the organic amine is piperidine, for example); and amidines such as azabicycloundecene, diazabicycloundecene toluenesulfonic acid salt, and diazabicycloundecene octylic acid salt.

The curing agent (B) in the film-forming composition may include two or more curing agents in different categories or of different types.

Typically, the curing agent (B) content in the film-forming composition is preferably 0.01 mass % or more and 40 mass % or less, more preferably 0.1 mass % or more and 20 mass % or less, and particularly preferably 1 mass % or more and 10 mass % or less relative to the total mass of the composition.

<Nitroxy Compound (C)>

The film-forming composition may include a nitroxy compound (C). It is preferable that the film-forming composition include the nitroxy compound (C) because it is possible to form a silica-based coating with a lower dielectric constant. It is also preferable that the film-forming composition include the nitroxy compound (C) because the amount of residue remaining in the resulting silica-based coating (an impurity derived from the silica-based coating) may be reduced even when the baking temperature for formation of the silica-based coating is low, for example, at 250° C. or less (for example, within the range from 200° C. or more to 250° C. or less). In cases where the amount of residue remaining in the silica-based coating is low, the generation of gas derived from the residue of the silica-based coating or from a degradation product of the residue in the coating is reduced even when the silica-based coating is in a high-temperature atmosphere or in a reduced-pressure atmosphere. The nitroxy compound (C) is not particularly limited, so long as the compound is stable as a nitroxide radical.

Suitable examples of the nitroxy compound (C) include a compound including a structure represented by the following formula (c1).

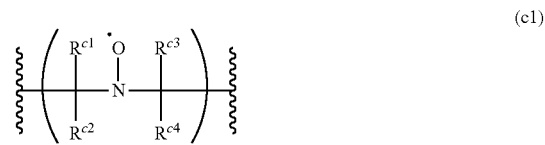

In the formula (c1), $R^{c1}$, $R^{c2}$, $R^{c3}$, and $R^{c4}$ are each independently a hydrogen atom or an organic group having 1 to 10 carbon atoms. $R^{c1}$ and $R^{c2}$ may be bound to each other to form a ring. $R^{c3}$ and $R^{c4}$ may also be bound to each other to form a ring.

When the film-forming composition includes a compound including a structure represented by the above formula (c1) as the nitroxy compound (C), a silica-based coating with a lower dielectric constant is easily formed.

In the formula (c1), it is preferable that $R^{c1}$, $R^{c2}$, $R^{c3}$, and $R^{c4}$ are each independently an alkyl group or an alkyl group substituted with a heteroatom. As the alkyl group, a methyl group, an ethyl group, an n-propyl group, and an isopropyl group are preferable. Suitable examples of the heteroatom include a halogen atom, an oxygen atom, a sulfur atom, a nitrogen atom, and the like.

As suitable specific examples of the nitroxy compound (C), di-tert-butyl nitroxide, di-1,1-dimethylpropyl nitroxide, di-1,2-dimethylpropyl nitroxide, di-2,2-dimethylpropyl nitroxide, and a compound represented by the following formula (c2), (c3), or (c4) are preferable.

Among these, for easily forming a silica-based coating with a lower dielectric constant, a compound represented by the following formula (c2), (c3), or (c4) is more preferable.

-continued

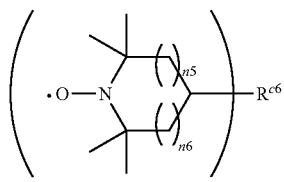
(c4)

In the formulae (c2), (c3), and (c4), $R^{c5}$ represents a hydrogen atom, an alkyl group having 1 or more and 12 or less carbon atoms, a hydroxy group, an amino group, a carboxy group, a cyano group, an alkyl group substituted with a heteroatom, or a monovalent organic group bound via an ether bond, an ester bond, an amide bond, or a urethane bond.

$R^{c6}$ represents a divalent or trivalent organic group.

n1 and n2 are integers that satisfy $1 \leq n1+n2 \leq 2$.

n3 and n4 are integers that satisfy $1 \leq n3+n4 \leq 2$.

n5 and n6 are integers that satisfy $1 \leq n5+n6 \leq 2$.

n7 is 2 or 3.

Suitable specific examples of the compound represented by the formula (c2) include the following compounds. In the following formulae, $R^{c7}$s each independently represent an optionally substituted alkyl group having 1 or more and 20 or less carbon atoms, an optionally substituted aromatic group, or an optionally substituted alicyclic group.

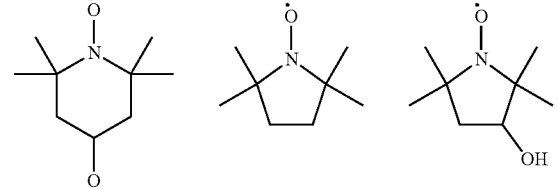

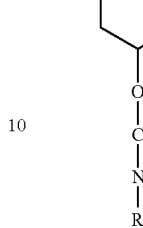

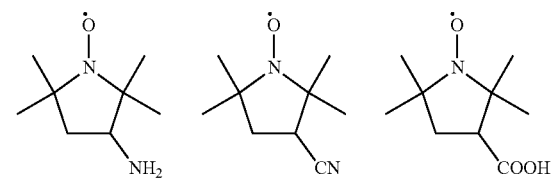

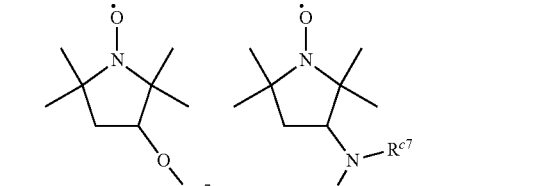

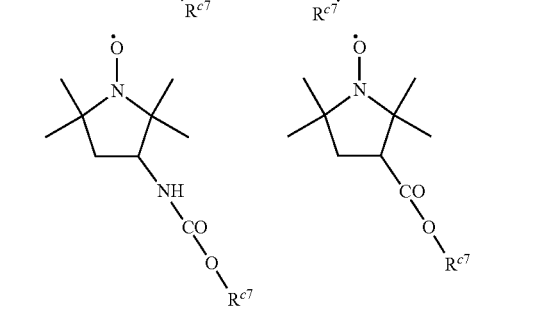

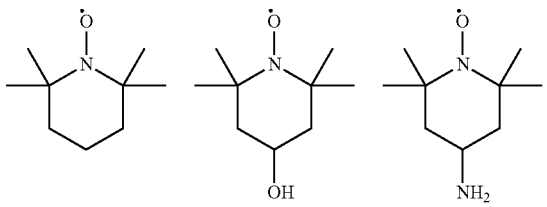

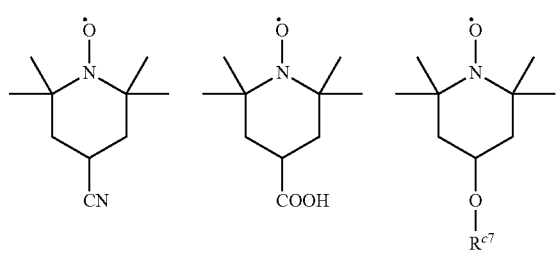

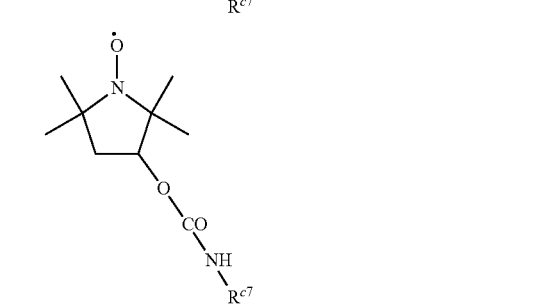

Suitable specific examples of the compound represented by the formula (c3) include the following compounds.

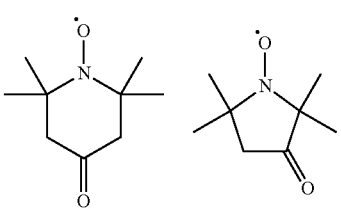

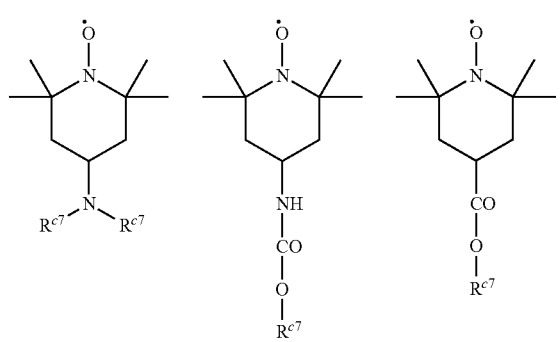

Suitable specific examples of the compound represented by the formula (c4) include the following compounds.

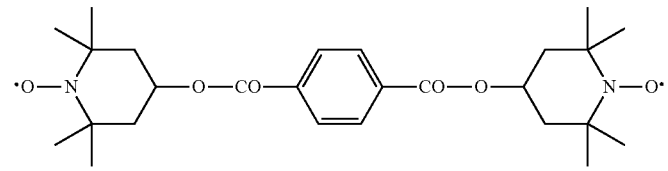

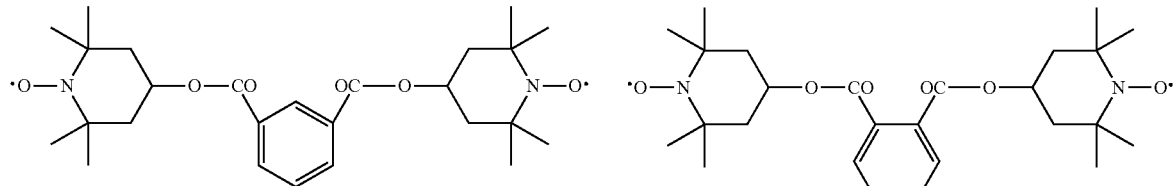

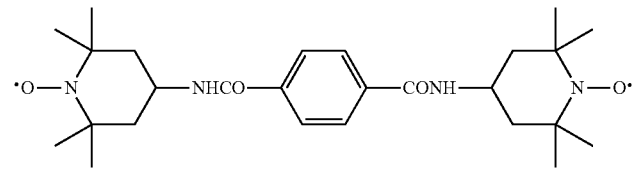

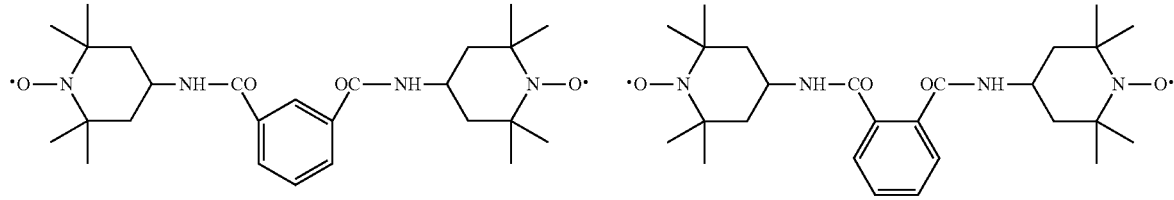

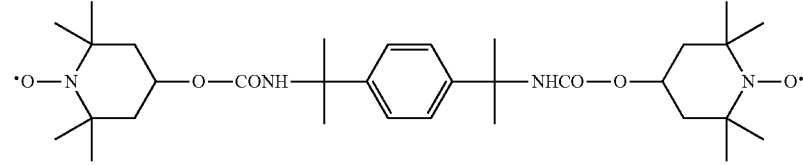

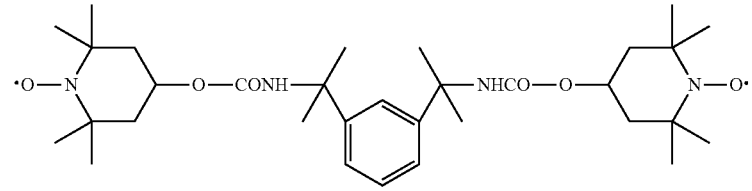

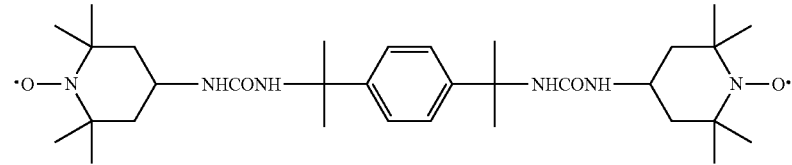

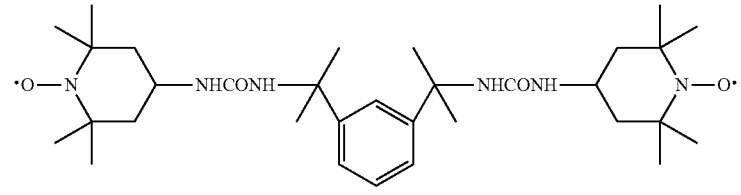

For easily forming a silica-based coating with a lower dielectric constant, further preferable examples of the nitroxy compound (C) include 2,2,6,6-tetramethylpiperidine 1-oxyl free radical, 4-hydroxy-2,2,6,6-tetramethylpiperidine 1-oxyl free radical, 4-amino-2,2,6,6-tetramethylpiperidine 1-oxyl free radical, 4-carboxy-2,2,6,6-tetramethylpiperidine 1-oxyl free radical, 4-cyano-2,2,6,6-tetramethylpiperidine 1-oxyl free radical, 4-(methacrylic acid)-2,2,6,6-tetramethylpiperidine 1-oxyl free radical, 4-(acrylic acid)-2,2,6,6-tetramethylpiperidine 1-oxyl free radical, 4-oxo-2,2,6,6-tetramethylpiperidine 1-oxyl free radical, 3-carboxy-2,2,5,5-tetramethylpyrrolidine 1-oxyl free radical, 4-acetamide-2,2,6,6-tetramethylpiperidine 1-oxyl free radical, 4-(2-chloroacetamide)-2,2,6,6-tetramethylpiperidine 1-oxyl free radical, 4-hydroxy-2,2,6,6-tetramethylpiperidine 1-oxylbenzoate free radical, 4-isothiocyanato-2,2,6,6-tetramethylpiperidine 1-oxyl free radical, 4-(2-iodoacetamide)-2,2,6,6-tetramethylpiperidine 1-oxyl free radical, and 4-methoxy-2,2,6,6-tetramethylpiperidine 1-oxyl free radical.

The nitroxy compound (C) may be used alone, or two or more nitroxy compounds may be used in combination.

The nitroxy compound (C) content in the film-forming composition may be very small. For easily forming a silica-based coating with a lower dielectric constant, the nitroxy compound (C) content in the film-forming composition is preferably 0.005 mass % or more and more preferably 0.009 mass % or more relative to the total mass of all the components of the film-forming composition except for the (S) solvent.

The nitroxy compound (C) content in the film-forming composition is preferably 2 mass % or less and more preferably 1 mass % or less relative to the total mass of all the components of the film-forming composition except for the solvent (S).

<Solvent (S)>

The film-forming composition includes a solvent (S). The solvent (S) is not particularly limited, so long as the silicon-containing polymer (A) is soluble in it.

Suitable examples of the solvent (S) include alcohols including monoalcohols such as methanol, ethanol, propanol, and n-butanol;

polyhydric alcohols such as ethylene glycol, diethylene glycol, propylene glycol, and dipropylene glycol;

ketones such as acetone, methyl ethyl ketone, cyclohexanone, methyl-n-amyl ketone, methyl isoamyl ketone, and 2-heptanone;

lactone-ring-containing organic solvents such as •-butyrolactone;

polyhydric alcohol derivatives, including ester-bond-containing compounds such as ethylene glycol monoacetate, diethylene glycol monoacetate, propylene glycol monoacetate, and dipropylene glycol monoacetate, and ether-bond-containing compounds such as monoalkyl ethers, for example, monomethyl ether, monoethyl ether, monopropyl ether, and monobutyl ether, or monophenyl ethers of the above polyhydric alcohols or the above ester-bond-containing compounds, and the like;

cyclic ethers such as dioxane and esters such as methyl lactate, ethyl lactate, methyl acetate, ethyl acetate, butyl acetate, methyl pyruvate, ethyl pyruvate, methyl methoxypropionate, and ethyl ethoxy propionate;

aromatic organic solvents such as anisole, ethyl benzyl ether, cresyl methyl ether, diphenyl ether, dibenzyl ether, phenetole, butyl phenyl ether, ethylbenzene, diethylbenzene, amylbenzene, isopropylbenzene, toluene, xylene, cymene, and mesitylene; and nitrogen-containing organic solvents such as N,N,N',N'-tetramethylurea, N,N,2-trimethylpropionamide, N,N-dimethylacetamide, N,N-dimethylformamide, N,N-diethylacetamide, N,N-diethylformamide, 1,3-dimethyl-2-imidazolidinone, N-methylpyrrolidone, and N-ethylpyrrolidone.

Two or more of these solvents may be used in combination.

Among these solvents, propylene glycol monomethyl ether acetate (PGMEA), propylene glycol monomethyl ether (PGME), N,N,N',N'-tetramethylurea, and butanol are preferable.

It is also preferred that the solvent (S) include a cycloalkyl acetate represented by the following formula (S1). The film-forming composition includes a solvent (S) including a cycloalkyl acetate represented by the following formula (S1) together with the silicon-containing resin (A), thereby easily inhibiting the occurrence of cracks in a silica-based coating formed using the film-forming composition.

(In the formula (S1), $R^{S1}$ is an alkyl group having 1 or more and 3 or less carbon atoms, p is an integer of 1 or more and 6 or less, and q is an integer of 0 or more and (p+1) or less.)

Specific examples of the cycloalkyl acetate represented by the formula (S1) include cyclopropyl acetate, cyclobutyl acetate, cyclopentyl acetate, cyclohexyl acetate, cycloheptyl acetate, and cyclooctyl acetate.

Among these, cyclooctyl acetate is preferable because acquisition thereof is easy, and the occurrence of cracks is easily inhibited. Two or more cycloalkyl acetates represented by the formula (S1) may be combined as the solvent (S).

The content of the cycloalkyl acetate represented by the formula (S1) in the solvent (S) is not particularly limited, so long as the object of the present invention is not defeated. The content of the cycloalkyl acetate represented by the formula (S1) in the solvent (S) is typically, for example, 30 mass % or more, preferably 50 mass % or more, more preferably 70 mass % or more, and particularly preferably 90 mass % or more, and it may be 100 mass %.

When the silicon-containing polymer (A) included in the film-forming composition includes poly- or oligo-silane chain, the moisture content in the film-forming composition is preferably 0.5 mass % or less, more preferably 0.3 mass % or less, particularly preferably less than 0.3 mass % to inhibit cracks in a silica-based coating or easily form a silica-based coating with a low dielectric constant.

Moisture in the film-forming composition is derived from the solvent (S) in most cases. Therefore, the solvent (S) is preferably dehydrated so that the moisture content in the film-forming composition falls within the above range.

The amount of the solvent (S) to be used is not particularly limited, so long as the object of the present invention is not defeated. From the viewpoint of film-forming properties, the solvent (S) is used so that the solid content concentration in the film-forming composition is preferably 1 mass % or more and 50 mass or less and more preferably 10 mass % or more and 40 mass % or less. From the viewpoint of conformal properties, the solid content concentration in the film-forming composition is preferably 0.05 mass % or more and 20 mass % or less, more preferably 0.1 mass % or more and 10 mass % or less, and more preferably 0.5 mass % or more and 3 mass % or less.

The silicon-containing polymer (A) is used for a film-forming composition and moreover may be added to conventionally known light-sensitive/thermosensitive compositions as an adherence agent. In this case, the amount of the silicon-containing polymer (A) added is, for example, 0.1 mass % or more and 10 mass % or less as a solid content concentration.

<Other Components>

The film-forming composition may contain, in addition to the silicon-containing polymer (A) and the solvent (S), various components that are conventionally added to film-forming compositions used in various applications.

Examples of other components include a photopolymerization initiator, an acid generator, a base generator, a catalyst, a silane coupling agent, an adhesion promoter, a dispersant, a surfactant, an ultraviolet absorber, an antioxidant, a defoaming agent, a viscosity modifier, a colorant, and the like.

These components are blended, each in a typical amount, into the film-forming composition.

<Method for Producing Film-Forming Composition>

The method for producing the film-forming composition is not particularly limited. A typical method is to uniformly mix the components described above each in a predetermined amount and dissolve the solid matter in the solvent (S) to produce the film-forming composition. For removal of very small insoluble matter, the film-forming composition may be filtered through a filter with a desired pore size.

«Method for Forming Silicon-Containing Polymer Coating»

The method for forming a silicon-containing polymer coating includes a step of forming a coated film by applying the above-described film-forming composition to a substrate, and a step of drying the coated film.

The method for forming a coated film is not particularly limited.

For example, the film-forming composition is applied by a method such as a spraying method, a spin coating method, a roll coating method, a dipping method, or a drip method to form a coated film on a substrate.

The thickness of the coated film is not particularly limited. Typically, the coated film is formed in a thickness such that a silicon-containing polymer coating with a thickness of preferably 0.1 nm or more and 20·m or less, more preferably 0.5 nm or more and 1000 nm or less, further preferably 0.5 nm or more and 500 nm or less, and particularly preferably 1 nm or more and 10 nm or less can be formed.

Materials for the substrate are not particularly limited, and those which can withstand baking are preferable. Suitable examples of the materials for the substrate include inorganic materials such as metal, silicon, and glass, various materials conventionally used as materials for wafers (semiconductor wafers) and heat-resistant materials such as polyimide resin and polyamide-imide resin.

The thickness of a substrate is not particularly limited, and the substrate may also be a film or a sheet.

The substrate may have a raised portion and/or a recessed portion. The raised portions are, for example, an uneven portion on a wafer substrate caused in a lithography process, a raised form on a gate electrode, and various devices such as LED devices and organic EL devices. The recessed portion is formed, for example, by etching the surface of a substrate. When the film-forming composition according to the present invention is used, a coated film, in which the film thickness is uniform even when a substrate has raised and recessed portions on the surface thereof, and which is along the raised and recessed forms on the surface of the substrate, is easily formed.

The coated film thus formed is then dried. Examples of the method for drying a coated film include natural drying and baking treatment at a temperature of 60° C. or more and 150° C. or less. A silicon-containing polymer coating having a protective function such as antioxidation is formed on the surface of a substrate by drying treatment. In addition, the silicon-containing polymer coating is also useful as a precursor film of a silica-based coating described below.

«Method for Forming Silica-Based Coating»

The method for forming a silica-based coating includes a step of forming a coated film by applying the above-described film-forming composition on a substrate, and a step of drying the coated film to form a silicon-containing polymer coating and then baking the silicon-containing polymer coating or baking the coated film.

The method for forming a coated film is the same as the method for forming a coated film in the method for forming a silicon-containing polymer coating.

The thickness of the coated film is not particularly limited. Typically, the coated film is formed in a thickness such that a silica-based coating with a thickness of preferably 0.1 nm or more and 20·m or less, more preferably 0.5 nm or more and 1000 nm or less, further preferably 0.5 nm or more and 500 nm or less, and particularly preferably 1 nm or more and 10 nm or less can be formed.

By using a composition including the above-described silicon-containing polymer, for example, when forming a silica-based coating, a coated film having good adhesive properties to a substrate can be formed. Accordingly, by baking the coated film on the substrate, a silica-based coating having good adhesive properties to the substrate is easily formed. In addition, a silica-based coating having good conformal properties is easily formed on a substrate having an uneven portion.

Materials for the substrate are not particularly limited, and those which can withstand baking are preferable. Suitable examples of the materials for the substrate are the same as the suitable examples of the materials for the substrate in the method for forming a silicon-containing polymer coating. The thickness of a substrate is not particularly limited, and the substrate may also be a film or a sheet.

The substrate may have a raised portion and/or a recessed portion. The raised portions are, for example, an uneven portion on a wafer substrate caused in a lithography process, a raised form on a gate electrode, and various devices such as LED devices and organic EL devices. The recessed portion is formed, for example, by etching the surface of a substrate. When the film-forming composition according to the present invention is used, a coated film, in which the film thickness is uniform even when a substrate has raised and recessed portions on the surface thereof, and which is along the raised and recessed forms on the surface of the substrate, is easily formed.

After forming a coated film on a substrate, the coated film is dried to form a silicon-containing polymer coating, and the silicon-containing polymer coating is then baked, or the coated film is then baked to form a silica-based coating.

The drying method is as described in the method for forming a silicon-containing polymer coating.

The baking method is not particularly limited, and baking is typically carried out using an electric furnace or the like. A typical baking temperature is preferably 200° C. or more, more preferably 300° C. or more, and further preferably 350° C. or more. The upper limit is not particularly limited, but it is, for example, 1000° C. or less, preferably 500° C. or less, and more preferably 400° C. or less. By the baking treatment, a coating having a high protective function in which $-SiR^3{}_nR^4{}_{(3-n)}$ in the formula (1) is changed to siloxane is formed on the surface of the substrate. In cases where the film-forming composition includes the curing agent (B) and/or the nitroxy compound (C), a silica-based coating with a lower dielectric constant can be formed, and the amount of residue remaining in the silica-based coating (an impurity derived from the silica-based coating) can be reduced even when the lower limit of the baking temperature is lowered to 200° C. The atmosphere for the baking is not particularly limited, and the baking may be carried out in an inert gas atmosphere such as a nitrogen atmosphere or an argon atmosphere, in a vacuum, or under reduced pressure.

The baking may be carried out in the atmosphere or with appropriate control of the oxygen concentration. When both the drying step and baking step are carried out, the steps may be continuously carried out, or another substrate treatment step may be carried out between the steps.

The silica-based coating thus formed has a film thickness of, for example, 0.1 nm or more and 20·m or less. The silica-based coating formed in accordance with the above method is suitably used in applications such as an interlayer insulation material. In addition, the amount of residue remaining in the silica-based coating (an impurity derived from the silica-based coating) can be reduced.

«Production Method for Silicon-Containing Polymer»

A preferred example of the production method for the above-described silicon-containing polymer will now be described. The preferred production method for the above-described silicon-containing polymer is a method including causing an ene-thiol reaction between a precursor polymer which includes at least one of poly- or oligo-siloxane chain and poly- or oligo-silane chain in a molecular chain and in which an unsaturated hydrocarbon group represented by the following formula (2-I) or a mercapto group-containing group represented by the following formula (2-II) is bound onto a silicon atom, and a carboxylic acid derivative represented by the following formula (1-I) or a unsaturated group-containing compound represented by the following formula (1-II).

The formula (24), formula (2-II), formula (1-I) and formula (1-II) are as shown below:

$$-R^5-CR^6=CH_2 \quad (2\text{-}I)$$

$$-R^1-SH \quad (2\text{-}II)$$

$$HS-R^2-SiR^3{}_nR^4{}_{(3-n)} \quad (1\text{-}I)$$

$$CH_2=CR^8-R^7-SiR^3{}_nR^4{}_{(3-n)} \quad (1\text{-}II).$$

In the formula (2-I), $R^5$ is a single bond or a hydrocarbon group having 1 or more and 8 or less carbon atoms, $R^6$ is a hydrogen atom or a hydrocarbon group having 1 or more and 8 or less carbon atoms. In cases where both $R^5$ and $R^6$ are hydrocarbon groups, the sum of the number of carbon atoms in the hydrocarbon group as $R^5$ and the number of carbon atoms in the hydrocarbon group as $R^6$ is 2 or more and 8 or less.

In the formula (1-II), $R^3$, $R^4$, and n are the same as the $R^3$, $R^4$, and n in the formula (1). $R^7$ is a single bond or a hydrocarbon group having 1 or more and 8 or less carbon atoms. $R^8$ is a hydrogen atom or a hydrocarbon group having 1 or more and 8 or less carbon atoms. In cases where both $R^7$ and $R^8$ are hydrocarbon groups, the sum of the number of carbon atoms in the hydrocarbon group as $R^7$ and the number of carbon atoms in the hydrocarbon group as $R^8$ is 2 or more and 8 or less.

A precursor polymer which includes poly- or oligo-siloxane chain in a molecular chain and in which an unsaturated hydrocarbon group represented by the formula (2-I) or a mercapto group-containing group represented by the formula (2-II) is bound onto a silicon atom can be produced, for example, by hydrolytic condensation of an alkoxysilane compound having a structure corresponding to the structure of siloxane chain as described above about the poly- or oligo-siloxane chain.

The method for introducing a group represented by the formula (2-I) or a group represented by the formula (2-II) into poly- or oligo-silane chain is not particularly limited. Typically, a halosilane having a group represented by the formula (2-I) or a group represented by the formula (2-II) is independently polymerized or is copolymerized with another halosilane in the presence of metal magnesium to form poly- or oligo-silane chain having a group represented by the formula (2-I) or a group represented by the formula (2-II).

The above-described silicon-containing polymer is obtained by an ene-thiol reaction between a precursor polymer which includes at least one of poly- or oligo-siloxane chain and poly- or oligo-silane chain in a molecular chain and in which an unsaturated hydrocarbon group represented by the formula (2-I) is bound onto a silicon atom, and a mercaptosilane compound represented by the formula (1-I).

As the unsaturated hydrocarbon group represented by the formula (24), a vinyl group and an allyl group are preferable.

As the mercaptosilane compound represented by the formula (1-I), 3-mercaptopropyltrimethoxysilane, 3-mercaptopropyltriethoxysilane, 3-mercaptopropylmethyldimethoxysilane, 3-mercaptopropylmethyldiethoxysilane, 2-mercaptoethyltrimethoxysilane, 2-mercaptoethyltriethoxysilane, 2-mercaptoethylmethyldimethoxysilane, and 2-mercaptoethylmethyldiethoxysilane are preferable.

In addition, the above-described silicon-containing polymer can be obtained by an ene-thiol reaction between a precursor polymer which includes at least one of poly- or oligo-siloxane chain and poly- or oligo-silane chain in a molecular chain and in which a mercapto group-containing group represented by the formula (2-II) is bound onto a silicon atom, and an unsaturated group-containing silane compound represented by the formula (1-II). As the mercapto group-containing group represented by the formula (2-II), a mercaptomethyl group, a 2-mercaptoethyl group, and a 3-mercaptopropyl group are preferable.

As the unsaturated group-containing silane compound represented by the formula (1-II), vinyltrimethoxysilane, vinyltriethoxysilane, vinylmethyldimethoxysilane, vinylmethyldiethoxysilane, allyltrimethoxysilane, allyltriethoxysilane, allylmethyldimethoxysilane, and allylmethyldiethoxysilane are preferable.

Among these methods, the ene-thiol reaction between a precursor polymer in which an unsaturated hydrocarbon group represented by the formula (2-I) is bound onto a silicon atom and a carboxylic acid derivative represented by the formula (1-I) is preferably carried out, for example, because it is easy to prepare and acquire the precursor polymer.

The conditions of the ene-thiol reaction are not particularly limited, so long as the ene-thiol reaction proceeds well, and various conditions which have been conventionally used as the conditions of an ene-thiol reaction can be used.

When carrying out the ene-thiol reaction, a radical generator may be used for the purpose of promoting the reaction. Specific examples of the radical generator include azo-based radical generators such as 2,2'-azobisisobutyronitrile (AIBN), 2,2'-azobis(2,4-dimethylvaleronitrile), 1,1'-azobis(cyclohexanecarbonitrile), dimethyl-2,2'-azobisisobutyrate, and dimethyl-2,2'-azobis(2-methylpropionate). These radical generators may be used alone, or two or more radical generators may be used in combination.

The ene-thiol reaction may be carried out in the presence of a solvent or without a solvent. The ene-thiol reaction is preferably carried out in the presence of a solvent because it is easy to allow the reaction to quickly and uniformly proceed. The solvent may be a polar solvent or a nonpolar solvent, and it is preferably a nonpolar solvent.

Suitable specific examples of the solvent which can be used for the ene-thiol reaction include aliphatic hydrocarbon solvents such as pentane, hexane, heptane, octane, cyclohexane, cycloheptane, decalin, and norbornane; aromatic hydrocarbon solvents such as benzene, toluene, and xylene; ether solvents such as diethyl ether, dibutyl ether, tetrahydrofuran, and dimethoxyethane; ketone solvents such as acetone, methylethylketone, and cyclohexanone; halogenated hydrocarbon solvents such as dichloromethane and dichloroethane; alcohol solvents such as methanol, ethanol, n-propanol, and isopropanol; water; and the like. These solvents may be used alone, or two or more solvents may be used in combination.

The amount of solvent used is not particularly limited. Typically, the amount is preferably 10 parts by mass or more and 5000 parts by mass or less, and more preferably 50 parts by mass or more and 2000 parts by mass or less with respect to a total of 100 parts by mass of material compounds.

The reaction temperature for the ene-thiol reaction is not particularly limited, so long as the reaction proceeds well. Typically, the reaction temperature is preferably 20° C. or more and 200° C. or less, more preferably 30° C. or more and 100° C. or less, and further preferably 40° C. or more and 80° C. or less from the viewpoint of reaction efficiency.

The reaction time may be properly adjusted so that the ene-thiol reaction proceeds to a desired degree. Typically, the reaction time is preferably 1 hour or more and 96 hours or less, more preferably 2 hours or more and 48 hours or less, and further preferably 3 hours or more and 48 hours or less.

It should be noted that the above-described silicon-containing polymer can also be obtained by polymerizing only a halosilane having a group represented by the formula (1) or copolymerizing it with another halosilane in the presence of metal magnesium.

EXAMPLES

The present invention will now be described in more detail by way of Examples, but the present invention is not limited to these Examples.

Synthesis Example 1

(Synthesis of Precursor Polymer (Methylvinylsilane Polymer))

In a round-bottom flask equipped with a three-way cock with an inner volume of 1000 ml, 43.45 g of granular magnesium (grain diameter 20·m or more and 1000·m or less), 5.26 g of tris(acetylacetonato)iron(III) as a catalyst, and 1.26 g of anhydrous lithium chloride were put. The atmosphere in the reactor was set to 50° C. and the pressure therein was reduced to 1 mmHg (=133 kPa) to dry the inside of the reactor (flask). After this, dry argon gas was introduced into the reactor, and 132.13 ml of tetrahydrofuran (THF) dried with sodium-benzophenone ketyl in advance was added to the reactor. Subsequently, the contents in the reactor were stirred at 25° C. for about 60 minutes. Next, 42.0 g (0.3 mol) of methylvinyldichlorosilane purified by distillation in advance was added to this reactor by a syringe and the reaction mixture in the reactor was stirred at 25° C. for about 24 hours. After completion of the reaction, 1000 ml of 1 N (=1 mol/L) hydrochloric acid was put in the reaction mixture, and a formed precursor polymer was then extracted by 500 ml of toluene. The toluene phase was washed with 200 ml of pure water ten times, and the toluene phase was then dried over anhydrous magnesium sulfate. Subsequently, toluene was distilled off from the toluene phase to give 35.81 g of a linear methylvinylsilane polymer (mass average molecular weight (Mw) 4000).

Synthesis Example 2

A methylvinylsilane polymer was obtained as a precursor polymer in the same manner as in Synthesis Example 1, except that the stirring time after adding methylvinyldichlorosilane was changed to 12 hours. The mass average molecular weight (Mw) of the obtained methylvinylsilane polymer was 1900.

Synthesis Example 3

A methylvinylsilane polymer was obtained as a precursor polymer in the same manner as in Synthesis Example 1, except that the stirring time after adding methylvinyldichlorosilane was changed to 48 hours.

The mass average molecular weight (Mw) of the obtained methylvinylsilane polymer was 7000.

Examples 1 to 3

In a 300 ml flask, 4.3 g of a precursor polymer described in Table 1, 6.45 g of 3-mercaptopropyltrimethoxysilane, 0.43 g of AIBN, and 81.7 ml of mixed solvent of tetrahydrofuran (THF) and cyclohexyl acetate were put.

The mixture in the flask was refluxed in an 80° C. water bath with stirring for about 6 hours. Subsequently, the mixture was dried in an evaporator to obtain a silicon-containing polymer having a 2-(3-trimethoxysilylpropylthio)ethyl group as an objective substance. It was verified by IR that vinyl groups disappeared and trimethoxysilyl groups were formed.

The mass average molecular weights (Mw) of the obtained silicon-containing polymers are shown in Table 1.

| | Precursor polymer | Molecular weight (Mw) of silicon-containing polymer |
| --- | --- | --- |
| Example 1 | Synthesis Example 2 | 3000 |
| Example 2 | Synthesis Example 1 | 6000 |
| Example 3 | Synthesis Example 3 | 10500 |

Examples 4 to 7, and Comparative Examples 1 to 3

A silicon-containing polymer of the type shown in Table 2 was dissolved in a solvent of the type shown in Table 2 so that the solid content concentration was 10 mass % to obtain a film-forming composition in each Example and Comparative Example. In Table 2, CHXA is cyclohexyl acetate, and PGME is propylene glycol monomethyl ether.

Heat resistance was evaluated using the obtained film-forming compositions in accordance with the following method.

<Evaluation of Heat Resistance>

A film-forming composition in each Example and Comparative Example was spin-coated onto a silicon wafer, which was pre-baked at 100° C. for 2 minutes. Subsequently, post-baking was carried out at 350° C. for 30 minutes to form a film including a silicon-containing polymer. The film after post-baking (film thickness: about 1·m) was heated to 500° C. at a rate of 10° C./min. In cases where the weight of the remaining film was 97% or more when the temperature reached 500° C., the composition was evaluated as good, and in cases where the weight was less than 97%, the composition was evaluated as bad.

Examples 8 to 11, and Comparative Examples 4 to 6

Film-forming compositions in Examples 8 to 11 and Comparative Examples 4 to 6 were obtained in the same manner as in Examples 4 to 7 and Comparative Examples 1 to 3, except that the solid content concentration was changed from 10 mass % to 1 mass %. Adhesive properties were evaluated using the obtained film-forming compositions in accordance with the following method.

<Evaluation of Adhesive Properties>

A silicon wafer substrate having a trench pattern was immersed in a solution of a film-forming composition of each Example and Comparative Example at a fixed time and then lifted out. Subsequently, the silicon wafer substrate was washed with alcohol and dried. Changes in the surface of the substrate were observed before and after the immersion treatment by SEM. As a result of observation, when changes in the surface of the substrate were observed, the composition was evaluated as good, and when changes in the surface of the substrate were not observed, the composition was evaluated as bad.

| | Silicon-containing polymer | | | Heat | Adhesive |
|---|---|---|---|---|---|
| | Type | Mw | Solvent | resistance | property |
| Example 4/ Example 8 | Example 1 | 3000 | CHXA | good | good |
| Example 5/ Example 9 | Example 1 | 3000 | PGME | good | good |
| Example 6/ Example 10 | Example 2 | 6000 | CHXA | good | good |
| Example 7/ Example 11 | Example 3 | 10500 | CHXA | good | good |
| Comparative Example 1/ Comparative Example 4 | Synthesis Example 2 | 1900 | CHXA | good | bad |
| Comparative Example 2/ Comparative Example 5 | Synthesis Example 1 | 4000 | CHXA | good | bad |
| Comparative Example 3/ Comparative Example 6 | Synthesis Example 3 | 7000 | CHXA | good | bad |

From Table 2, it is found that that when using the film-forming compositions in Examples 8 to 11, films including a silicon-containing polymer were formed on the surface of the substrate by immersion. On the other hand, it is found that, when using the film-forming compositions in Comparative Examples 4 to 6, films formed by immersion were peeled off by alcohol washing.

That is, it is found that, when using the film-forming compositions in Examples 8 to 11, films which are not easily peeled off from the surface of the substrate by alcohol washing and which solidly adhere to the surface of the substrate were formed.

In the evaluation of adhesive properties using the film-forming compositions in Examples 8 to 11, it was verified by SEM observation that films along a trench pattern on the surface of the substrate were conformally formed.

What is claimed is:

1. A silicon-containing polymer, comprising poly- or oligo-silane chain in a molecular chain, wherein one or more groups represented by a following formula (1) are bound onto a silicon atom in the silicon-containing polymer;

$$-R^1-S-R^2-SiR^3_nR^4_{(3-n)} \quad (1)$$

wherein, in the formula (1), $R^1$ and $R^2$ are each independently a hydrocarbon group having 1 or more and 10 or less carbon atoms, $R^3$ is a hydroxy group or a group to form a silanol group by hydrolysis, $R^4$ is an optionally substituted hydrocarbon group having 1 or more and 10 or less carbon atoms, and n is an integer of 1 or more and 3 or less.

2. The silicon-containing polymer according to claim 1, wherein the molecular chain comprises only poly- or oligo-silane chain.

3. The silicon-containing polymer according to claim 1, wherein the molecular chain is linear.

4. The silicon-containing polymer according to claim 1, wherein the number of moles of a group represented by the formula (1) is 0.05 mol or more and 2.0 mol or less with respect to 1 mol of silicon atom in the silicon-containing polymer.

5. The silicon-containing polymer according to claim 4, wherein the number of moles of a group represented by the formula (1) is 0.2 mol or more and 1.0 mol or less with respect to 1 mol of silicon atom in the silicon-containing polymer.

6. The silicon-containing polymer according to claim 1, wherein the $R^3$ is an alkoxy group having 1 or more and 4 or less carbon atoms and the n is 3.

7. A film-forming composition, comprising the silicon-containing polymer (A) according to claim 1 and a solvent (S).

8. A method for forming a silicon-containing polymer coating, the method comprising:
    forming a coated film by applying the film-forming composition according to claim 7 onto a substrate; and
    drying the coated film.

9. A method for forming a silica-based coating, the method comprising:
    forming a coated film by applying a film-forming composition onto a substrate;
    the film-forming composition comprising a silicon-containing polymer (A) and a solvent (S),
    the silicon-containing polymer comprising at least one of poly- or oligo-siloxane chain and poly-or oligo-silane chain in a molecular chain, wherein one or more groups represented by a following formula (1) are bound onto a silicon atom in the silicon-containing polymer;

$$-R^1-S-R^2-SiR^3_nR^4_{(3-n)} \quad (1)$$

wherein, in the formula (1), $R^1$ and $R^2$ are each independently a hydrocarbon group having 1 or more and 10 or less carbon atoms, $R^3$ is a hydroxy group or a group to form a silanol group by hydrolysis, $R^4$ is an optionally substituted hydrocarbon group having 1 or more and 10 or less carbon atoms, and n is an integer of 1 or more and 3 or less;
    drying the coated film to form a silicon-containing polymer coating; and then
    baking the silicon-containing polymer coating or baking the coated film.

10. A production method for the silicon-containing polymer according to claim 1, the production method comprising:

causing an ene-thiol reaction between a precursor polymer which includes poly- or oligo-silane chain in a same molecular chain and in which an unsaturated hydrocarbon group represented by a following formula (2-I) or a mercapto group-containing group represented by a following formula (2-II) is bound onto a silicon atom, and a mercaptosilane compound represented by a following formula (1-I) or an unsaturated group-containing silane compound represented by a following formula (1-II);

$$-R^5-CR^6=CH_2 \quad (2\text{-}I)$$

wherein, in the formula (24), $R^5$ is a single bond or a hydrocarbon group having 1 or more and 8 or less carbon atoms, $R^6$ is a hydrogen atom or a hydrocarbon group having 1 or more and 8 or less carbon atoms, and in cases where both $R^5$ and $R^6$ are hydrocarbon groups, a sum of the number of carbon atoms in the hydrocarbon group as $R^5$ and the number of carbon atoms in the hydrocarbon group as $R^6$ is 2 or more and 8 or less, $$-R^1-SH \quad (2\text{-}II)$$

wherein, in the formula (2-II), $R^1$ is the same as the $R^1$ in the formula (1), $$HS-R^2-SiR^3{}_nR^4{}_{(3-n)} \quad (1\text{-}I)$$

wherein, in the formula (1-I), $R^2$, $R^3$, $R^4$, and n are the same as the $R^2$, $R^3$, $R^4$, and n in the formula (1), $$CH^2=CR^8-R^7-SiR^3{}_nR^4{}_{(3-n)} \quad (1\text{-}II)$$

wherein, in the formula (1-II) $R^3$, $R^4$, and n are the same as the $R^3$, $R^4$, and n in the formula (1), $R^7$ is a single bond or a hydrocarbon group having 1 or more and 8 or less carbon atoms, $R^8$ is a hydrogen atom or a hydrocarbon group having 1 or more and 8 or less carbon atoms, and in cases where both $R^7$ and $R^8$ are hydrocarbon groups, a sum of the number of carbon atoms in the hydrocarbon group as $R^7$ and the number of carbon atoms in the hydrocarbon group as $R^8$ is 2 or more and 8 or less.

11. The production method for the silicon-containing polymer according to claim 10, the method causing an ene-thiol reaction between the precursor polymer in which the unsaturated hydrocarbon group represented by the formula (2-I) is bound onto a silicon atom and the mercaptosilane compound represented by the formula (1-I).

* * * * *